US008529699B2

(12) United States Patent
Horio et al.

(10) Patent No.: US 8,529,699 B2
(45) Date of Patent: Sep. 10, 2013

(54) METHOD OF GROWING ZINC-OXIDE-BASED SEMICONDUCTOR AND METHOD OF MANUFACTURING SEMICONDUCTOR LIGHT EMITTING DEVICE

(75) Inventors: Naochika Horio, Tokyo (JP); Masayuki Makishima, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 1004 days.

(21) Appl. No.: 12/561,150

(22) Filed: Sep. 16, 2009

(65) Prior Publication Data
US 2010/0064966 A1 Mar. 18, 2010

(30) Foreign Application Priority Data

Sep. 16, 2008 (JP) ................................. 2008-236922
Sep. 16, 2008 (JP) ................................. 2008-236923

(51) Int. Cl.
*C30B 23/00* (2006.01)
*C30B 25/00* (2006.01)
*C30B 28/12* (2006.01)
*C30B 28/14* (2006.01)

(52) U.S. Cl.
USPC .................. 117/106; 117/84; 117/88; 117/89

(58) Field of Classification Search
USPC ......................................... 117/106, 84, 88, 89
See application file for complete search history.

(56) References Cited

U.S. PATENT DOCUMENTS

| 6,127,202 A * | 10/2000 | Kapur et al. ..................... 438/47 |
| 7,115,167 B2* | 10/2006 | Hooper et al. ................. 117/105 |
| 2006/0170013 A1* | 8/2006 | Kato et al. ..................... 257/252 |
| 2008/0118769 A1* | 5/2008 | Kawasaki et al. ............. 428/620 |
| 2008/0188769 A1* | 8/2008 | Lu ................................. 600/569 |

FOREIGN PATENT DOCUMENTS

| JP | 3424814 B2 | 5/2003 |
| JP | 2004-099412 A | 4/2004 |
| JP | 2005-298867 A | 10/2005 |
| JP | 2005-302940 A | 10/2005 |
| JP | 2005-340370 A | 12/2005 |
| JP | 3859148 B2 | 9/2006 |
| JP | 2007-251027 A | 9/2007 |

OTHER PUBLICATIONS

Japanese Office Action dated May 22, 2012 (and English translation thereof) in counterpart Japanese Application No. 2008-236922.
Japanese Office Action dated May 22, 2012 (and English translation thereof) in counterpart Japanese Application No. 2008-236923.

* cited by examiner

*Primary Examiner* — James McDonough
(74) *Attorney, Agent, or Firm* — Holtz, Holtz, Goodman & Chick, PC

(57) ABSTRACT

A method includes the steps of, using water vapor and a metalorganic compound not containing oxygen, (a) performing crystal growth at a low growth temperature and at a low growth pressure in the range of 1 kPa to 30 kPa to form a low-temperature grown single-crystal layer; and (b) performing crystal growth at a high growth temperature and at a pressure higher than the low growth pressure to form a high-temperature grown single-crystal layer on the low-temperature grown single-crystal layer.

23 Claims, 18 Drawing Sheets

FIG.3A AS GROWN
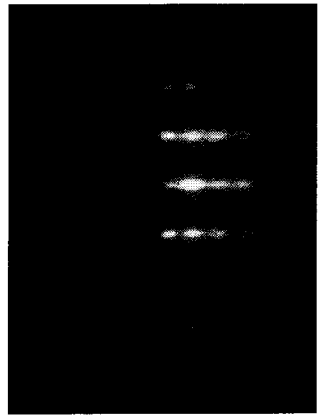
FIG.3B 800°C - 3min

Pg=80kPa, TH=1.0μm

Pg=10kPa, TH=1.0μm

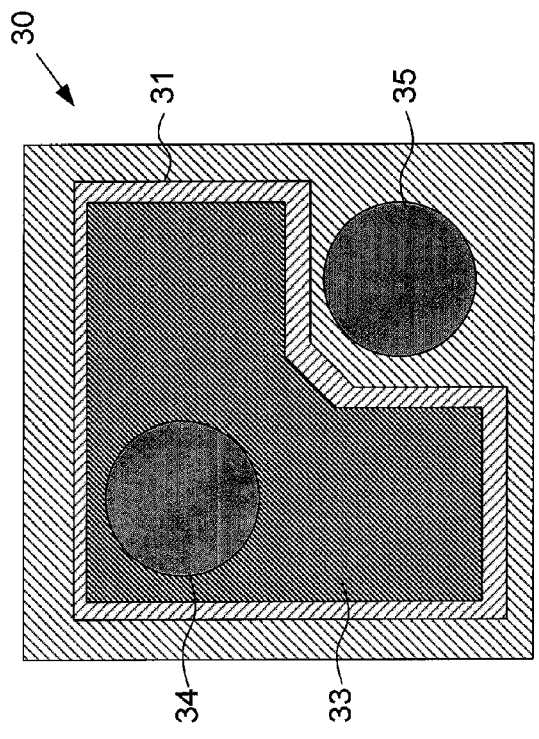
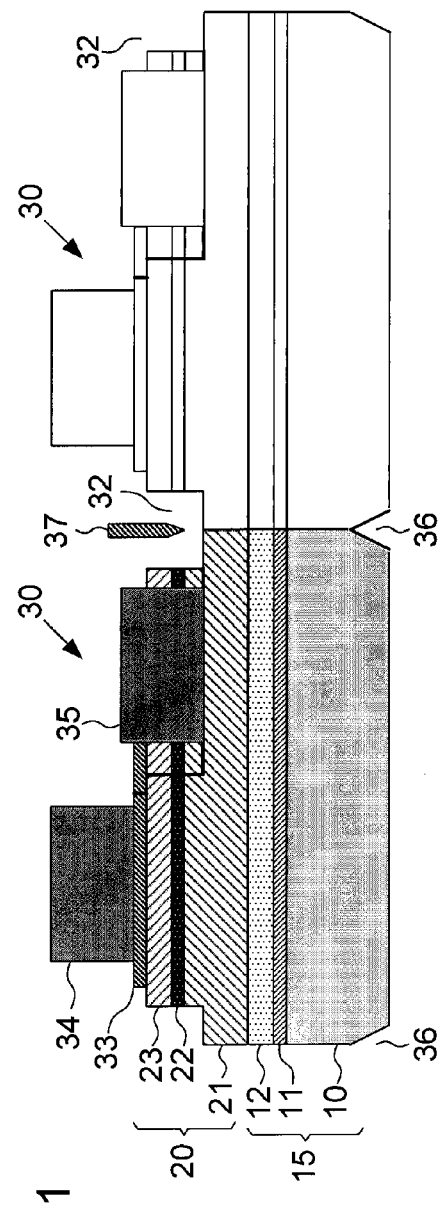
FIG.10
FIG.11

AS GROWN

800°C - 3min

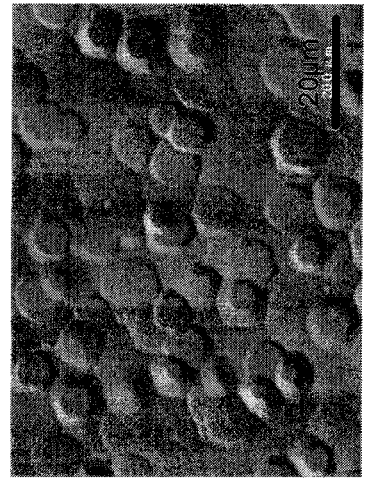
FIG.19A  Tg=800°C
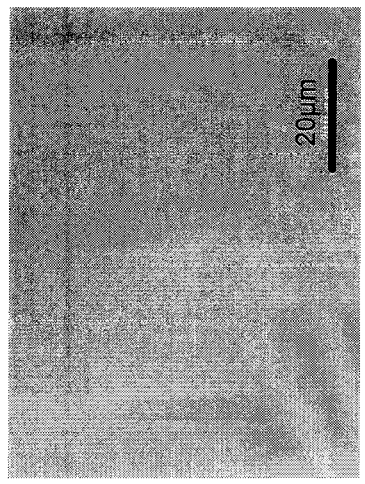
FIG.19B  Tg=680°C

METHOD OF GROWING ZINC-OXIDE-BASED SEMICONDUCTOR AND METHOD OF MANUFACTURING SEMICONDUCTOR LIGHT EMITTING DEVICE

BACKGROUND OF THE INVENTION

1. Field of the Invention

The present invention relates to a method of growing a zinc-oxide-based semiconductor and a method of manufacturing a semiconductor device, and particularly to a method of growing a zinc-oxide-based semiconductor layer by an MOCVD method and a method of manufacturing a semiconductor light emitting device using the method.

2. Description of the Related Art

Zinc oxide (ZnO) is a direct transition semiconductor having band gap energy of 3.37 eV at room temperature and expected to serve as a material for optical devices of a blue to ultraviolet range. In particular, the binding energy of excitons thereof being 60 meV with refractive index n=2.0, ZnO has physical properties extremely suitable for semiconductor light emitting devices. Further, not being limited to light emitting and light receiving devices, ZnO can be widely applied to surface acoustic wave (SAW) devices, piezoelectric devices, and the like. Moreover, ZnO has features that its raw materials are inexpensive and that it is harmless to the environment and human bodies.

Generally, an MOCVD (Metal Organic Chemical Vapor Deposition) method and an MBE (Molecular Beam Epitaxy) method are being used as the crystal growth method of a zinc-oxide-based compound semiconductor. The MBE method is a crystal growth method performed under an ultra-high vacuum, and hence there is the problem that the apparatus for it is expensive and that productivity is low. In contrast, for the MOCVD method, the apparatus is relatively inexpensive, and large area growth and multi-wafer simultaneous growth are possible. Thus, the MOCVD method has the advantages of high throughput and being excellent in mass productivity and cost.

A zinc oxide crystal growth method using the MBE method wherein a low-temperature ZnO layer showing single-crystal characteristics is grown on, e.g., a sapphire substrate and then flattened by heat treatment at a high temperature and thereafter a high-temperature ZnO layer is grown to obtain a ZnO layer good in crystallinity is disclosed in, e.g., Japanese Patent No. 3424814 (Reference 1). More specifically, a low-temperature grown ZnO single-crystal layer formed at a growth temperature lower than a crystal growth temperature at which a ZnO single crystal is generally grown, is disclosed. However, the method disclosed in Reference 1 is a growth condition/method effective only for the MBE method and cannot be applied to the MOCVD method. That is, the growth conditions for the MBE method, where crystal growth in non-stoichiometry conditions is possible, cannot be applied, as it is, to the MOCVD method as well known (e.g., Japanese Patent Application Laid-Open Publication No. 2005-340370 (Reference 2)). Hence, methods of growing a single-crystal layer of a zinc-oxide-based semiconductor using the MOCVD method are being actively studied.

Various methods of growing zinc oxide (ZnO) or a zinc-oxide-based semiconductor on a substrate of another material such as sapphire ($Al_2O_3$) by the MOCVD method have been disclosed in, e.g., Reference 2 and Japanese Patent No. 3859148 (Reference 3). For example, Reference 2 discloses that micro crystals of MgZnO are formed as a preliminary buffer layer using gas $O_2$ as an oxygen source on an A-plane sapphire substrate or a C-plane silicon carbide substrate and that with the micro crystals as seed crystals, a MgZnO crystal is formed as an actual buffer layer entirely over the substrate. Reference 3 discloses that a low-temperature formed polycrystal or amorphous laminate is annealed at a high temperature so as to be a buffer layer. However, with these methods, when the polycrystal is single-crystallized by heat treatment, defects are left between adjacent crystal grain boundaries, and when the actual buffer layer is grown from the micro crystals with grains merging, defects are left. Hence, it is difficult to greatly reduce the number of crystal defects. As such, to date, attempts to improve crystallinity after forming a buffer layer of a polycrystal, micro crystals, or amorphous material have been made, but the method to improve crystallinity for the MOCVD method is complex, and it has been difficult to grow a ZnO-based crystal of high crystalline quality on a substrate.

As described above, methods of growing a ZnO-based single crystal on a sapphire substrate or the like using the MOCVD method have been proposed in large number, but they fall short of being a method of growing a ZnO-based single crystal of high crystalline quality in a simple, convenient way.

Further, in the case of the MOCVD method, if crystal growth is performed in the environment of a temperature at which crystallinity is improved (about 600° C. or higher), the ZnO-based single crystal tends to become a (hexagonal) columnar crystal, a mesh-like crystal, or a (hexagonal) disc-like crystal which is oriented in a c-axis direction. With this polycrystal or imperfect single crystal strongly oriented in a crystal axis direction, grain boundaries and dislocations cause a leak current or local current concentration in semiconductor devices, resulting in degradation of device characteristics and device lifetime. In particular, in semiconductor light emitting devices, leak currents and current concentration result in degradation of characteristics such as light-emission efficiency and device lifetime. Further, the crystal surface being not even or flat results in a decrease in process accuracy in semiconductor processes such as lithography and etching and a decrease in production yield, and also results in a decrease in production yield in cleavage, breaking, and the like.

As such, to date, it has been difficult to grow a ZnO-based semiconductor single crystal which is flat and has a small number of grain boundaries and dislocations, on a substrate of another material such as a sapphire substrate by the MOCVD method. In order to make semiconductor devices, especially semiconductor light emitting devices driven by large operating current density, higher in performance and reliability, it is extremely important to develop a method of growing a crystal close to an ideal crystal, which has a small numbers of crystal defects or low defect density and is flat.

SUMMARY OF THE INVENTION

The present invention was made in view of the above-described problems, and objects thereof are to provide a method of growing a zinc-oxide-based semiconductor crystal which has a small number of crystal defects or low defect density and is excellent in single-crystal quality and flatness over a substrate, and to provide high performance, high reliability semiconductor devices, especially high performance semiconductor light emitting devices excellent in light-emission efficiency and device lifetime, and in addition to provide semiconductor light emitting devices high in production yield and excellent in mass productivity.

According to the present invention, there is provided a method of growing a zinc-oxide-based semiconductor layer on a substrate by an MOCVD method, comprising the steps of, using water vapor and a metalorganic compound not containing oxygen, (a) performing crystal growth at a low growth temperature and at a low growth pressure in the range of 1 kPa to 30 kPa to form a low-temperature grown single-crystal layer; and (b) performing crystal growth at a high growth temperature and at a pressure higher than the low growth pressure to form a high-temperature grown single-crystal layer on the low-temperature grown single-crystal layer.

Further, according to the present invention, there is provided a method of manufacturing a semiconductor light emitting device by growing zinc-oxide-based semiconductor layers on a substrate by an MOCVD method, comprising the steps of, using water vapor and a metalorganic compound not containing oxygen, (a) performing crystal growth at a low growth temperature and at a low growth pressure in the range of 1 kPa to 30 kPa to form a low-temperature grown single-crystal layer; (b) performing crystal growth at a high growth temperature and at a pressure higher than the low growth pressure to form a high-temperature grown single-crystal layer on the low-temperature grown single-crystal layer; and (c) performing crystal growth at a high growth temperature and at a pressure higher than the low growth pressure to form a light emitting layer on the high-temperature grown single-crystal layer.

The low growth temperature may be a temperature in the range of 250° C. to 450° C.

The high growth temperature may be a temperature in the range of 700° C. to 850° C.

The pressure higher than the low growth pressure may be a pressure in the range of 40 kPa to 120 kPa.

According to another aspect of the present invention, the low-temperature grown single-crystal layer forming step (a) includes the steps of (a1) performing crystal growth at a first low growth temperature and at a low growth pressure in the range of 1 kPa to 30 kPa to form a first low-temperature grown single-crystal layer; and (a2) performing crystal growth at a second low growth temperature higher than the first low growth temperature and at a pressure higher than the low growth pressure to form a second low-temperature grown single-crystal layer on the first low-temperature grown single-crystal layer.

BRIEF DESCRIPTION OF THE DRAWINGS

FIGS. 3A and 3B show RHEED diffraction images of a ZnO layer for the cases of performing no heat treatment thereon after grown and of performing heat treatment, respectively;

FIG. 10 is a top plan view of a semiconductor light emitting device (LED);

FIG. 11 is a cross-sectional view of the semiconductor light emitting device (LED);

FIGS. 19A and 19B are respectively differential interference microscope images of the surface of a with-LED-operation-layer substrate produced according to the present invention and of the surface of the substrate having an LED operation layer formed at a growth temperature of 680° C.;

DETAILED DESCRIPTION OF THE INVENTION

Figure 1:
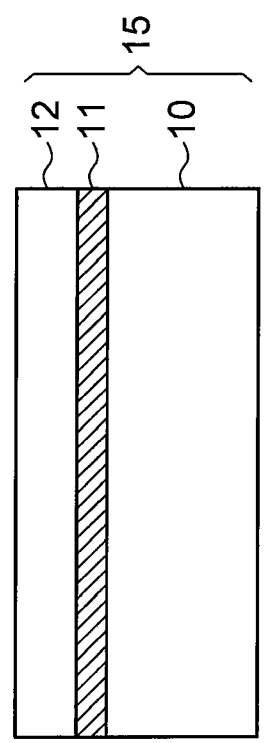
FIG. 1 is a cross-sectional view showing a low-temperature grown crystal layer and a ZnO-based semiconductor layer grown on a substrate according to the present invention.

The method of growing a zinc-oxide-based semiconductor crystal layer excellent in single-crystal quality and flatness over a substrate by the MOCVD method will be described in detail below with reference to the accompanying drawings. Description will be made taking a semiconductor light emitting device (LED: Light Emitting Diode) as an example of a semiconductor device formed by the growing method. The same reference numerals are used to denote substantially the same or equivalent portions throughout the figures cited below.

The "low growth temperature" defined herein refers to a temperature of, e.g., about 200° C. to 650° C. that is about 50° C. to 500° C. lower than a crystal growth temperature at which a ZnO single crystal is generally grown. The "high growth temperature" refers to a temperature of about 850° C. or lower that is a growth temperature generally suitable for growing a ZnO single crystal and higher than the "low growth temperature".

Embodiment 1

FIG. 1 is a cross-sectional view showing a zinc-oxide-based semiconductor crystal layer (hereinafter, simply referred to as a ZnO-based semiconductor layer) grown on a substrate 10 according to the present invention. More specifically, a ZnO layer 11 and a ZnO-based semiconductor layer 12 are grown on a sapphire substrate using the MOCVD method. Description will be made below taking as an example the case of growing $Mg_xZn_{(1-x)}O$ ($0 \leq x \leq 0.68$) as the ZnO-based semiconductor layer 12.

Note that the ZnO-based semiconductor may be another ZnO-based compound crystal, not being limited to $Mg_xZn_{(1-x)}O$. For example, it may be a ZnO-based compound crystal having a portion of Zn (zinc) replaced by calcium (Ca), or a ZnO-based compound crystal having some of O (oxygen) replaced by selenium (Se), sulfur (S), tellurium (Te), or the like.

The MOCVD apparatus (not shown) used in crystal growth has a reaction container (chamber), and inside the reaction chamber, there are provided a susceptor for holding the substrate 10, a heater for heating the susceptor, and a shower head for blowing material gas onto the substrate. The apparatus is provided with an exhaust pump and a pressure adjusting apparatus for adjusting the pressure inside the chamber.

A sapphire ($Al_2O_3$) substrate of an α-sapphire single crystal having a corundum structure is used as the substrate 10. In the embodiment, the ZnO layer 11 is grown on a sapphire A-plane using the sapphire A-plane ({11-20} plane) as a crystal growth plane. Hereinafter, a substrate with the sapphire A-plane ({11-20} plane) as the main plane (i.e., crystal growth plane) is also called an A-plane sapphire substrate. Here, Miller indices enclosed in "{ }" indicate representative values of equivalent planes.

In the embodiment, a material not containing oxygen was used as a metalorganic compound material (or organic metal material). That is, a material containing neither an oxygen atom nor an oxygen molecule in its constituent molecule was used.

More specifically, DMZn (dimethyl zinc) was used as a zinc (Zn) source, Cp2Mg (biscyclopentadienyl magnesium) as a magnesium (Mg) source, and TEGa (triethyl gallium) as a gallium (Ga) source. Other than these materials, DEZn (diethyl zinc), TMGa (trimethyl gallium), etc., can be used. The organic metal material not containing oxygen is easy to pyrolytically decompose at low temperatures and reacts with $O_2$ (oxygen) or $H_2O$ (water vapor) even at room temperature, hence being suitable for crystal growth at low temperature.

$H_2O$ (water vapor) was used as liquid material for an oxygen source. $H_2O$ has high reactivity with the metalorganic material not containing oxygen in its molecule even at about room temperature, hence being suitable for the low-temperature growth of a ZnO crystal. Further, the $H_2O$ molecule is large in the polarization within the molecule and has two lone electron pairs, hence being excellent in the ability of adsorption to a crystal surface or the like.

TMGa (trimethyl gallium) was used as an n-type impurity source, and $NH_3$ (ammonia) gas was used as a p-type impurity source. Note that these gases may be diluted with inert gas such as nitrogen or Ar (argon).

Further, nitrogen was used as carrier gas. The vapor of a liquid or solid material and gas material (hereinafter called material gas) are conveyed into the shower head by the carrier gas and supplied to the substrate.

Figure 2:
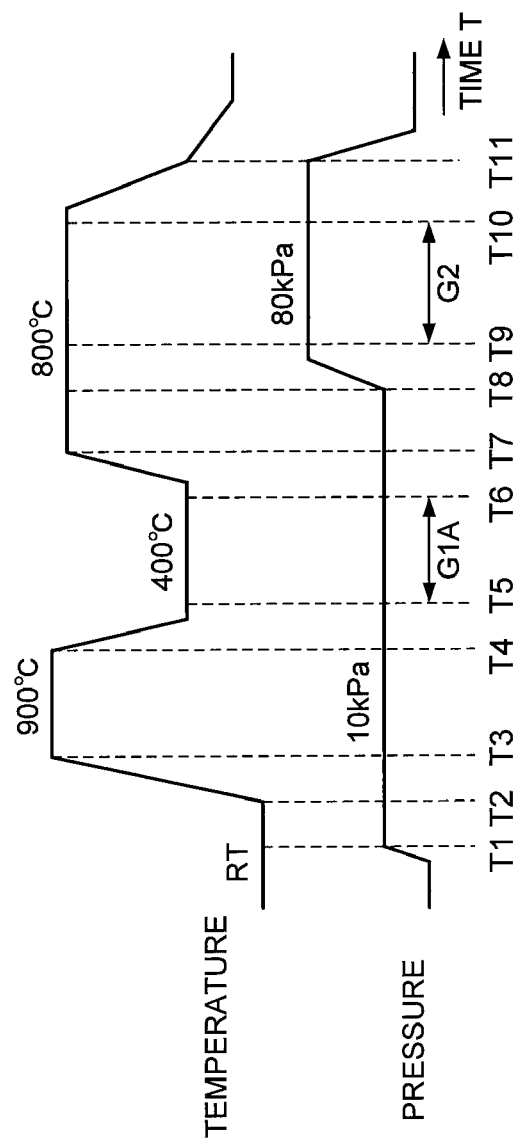
FIG. 2 shows a crystal growth sequence used in a crystal growth by an MOCVD method.

FIG. 2 shows a crystal growth sequence used in a crystal growth by the MOCVD method. First, the A-plane sapphire substrate 10 was set on the susceptor in the MOCVD apparatus, and the reaction chamber pressure was adjusted to 10 kPa (kilopascals) (time T=T1).

Then, $H_2O$ (water vapor) as an oxygen source started to be supplied from the shower head to the substrate 10 at a flow rate of 640 μmol/min (T=T2). Further, the substrate was raised in temperature by the heater from room temperature (RT) to 900° C., and the degassing of the substrate 10 was performed for 10 minutes (T=T3 to T4). Thereafter, $H_2O$ (water vapor) was kept flowing at the same flow rate until the growth finished.

After the degassing, the substrate temperature was lowered to 400° C., and DMZn (dimethyl zinc) as zinc material was supplied to the substrate 10 at a flow rate of 1 μmol/min for about 15 minutes (T=T5 to T6: the growth period of the ZnO layer 11 indicated by period G1A in FIG. 2). At this time, the ratio of the water vapor flow rate to the organic metal (DMZn) flow rate ($F_{H2O}/F_{DMZn}$ ratio), a so-called VI/II ratio, was at 640.

As such, the ZnO layer (low-temperature grown single-crystal layer, hereinafter also simply referred to as a first single-crystal layer) 11 of 25 nm thickness was grown under a reduced pressure growth condition (i.e., growth pressure Pg=10 kPa) at a growth temperature (Tg) of 400° C. at a growth rate of 1.7 nm/min.

After the growth of the ZnO layer 11, the substrate temperature was raised to 800° C. to perform heat treatment (annealing) for 10 minutes (T=T7 to T8). As described later, the crystallinity and flatness of the ZnO layer 11 were further improved by the heat treatment.

After the heat treatment (annealing) finished, the ZnO-based semiconductor layer 12 was grown at a higher temperature and a higher pressure than those of the ZnO layer (i.e., low-temperature grown single-crystal layer) 11. The reaction chamber pressure was increased from 10 kPa to 80 kPa. After the substrate temperature became stable, DMZn was supplied from the shower head onto the ZnO layer 11 at a flow rate of 10 μmol/min (T=T9 to T10: the growth period of the ZnO-based semiconductor layer 12 indicated by the period G2 in FIG. 2). At this time, the ratio of the water vapor flow rate to the organic metal (DMZn) flow rate ($F_{H2O}/F_{MO}$ ratio), the so-called VI/II ratio, was at 64. DMZn was supplied to the substrate 10 for about 60 minutes to form the ZnO-based semiconductor layer (ZnO layer) 12 about 1 μm thick.

Note that the standby time until the substrate temperature becomes stable before the growth of the ZnO-based semiconductor layer 12 can be shared with the heat treatment of the ZnO layer 11.

As such, the ZnO-based semiconductor layer 12 (high-temperature grown single-crystal layer, hereinafter also simply called a second single-crystal layer) about 1 μm thick was grown at a higher pressure (80 kPa) than the growth pressure of the ZnO layer 11 at growth temperature (Tg) as a high growth temperature (800° C.), at a growth rate of 17 nm/min. In the embodiment, description is made taking as an example the case of growing ZnO as the ZnO-based semiconductor layer 12, but not being limited to this, a $Mg_xZn_{(1-x)}O$ crystal, a ternary crystal, can be grown by using, e.g., Cp2Mg (biscyclopentadienyl magnesium) that is a metalorganic compound not containing an oxygen atom either, as well as DMZn.

After the growth of the ZnO-based semiconductor layer 12 finished, the substrate was cooled with keeping water vapor flowing. After the substrate temperature became 300° C. or lower, the supply of the water vapor was stopped (T=T11).

As described above, a with-crystal-grown-layer substrate (hereinafter simply called a with-grown-layer substrate) 15 that is the substrate having the ZnO layer (first single-crystal layer) 11 and the ZnO-based semiconductor layer (second single-crystal layer) 12 grown thereon was manufactured.

[Crystallinity of the ZnO Layer (Low-Temperature Grown Single-Crystal Layer or First Single-Crystal Layer) 11]

The ZnO layer 11 obtained through the above growth process (T=T5 to T6) is a single-crystal layer c-axis-oriented on the A-plane ({11-20} plane) sapphire substrate. That is, the {0001} plane of a zinc oxide single crystal is laid on a substrate of an α-sapphire single crystal with the {11-20} plane as the main plane. The single-crystal quality and flatness of the ZnO layer 11 were examined by RHEED (reflection high energy electron diffraction) measurement and AFM (atomic force microscope) measurement.

FIG. 3A shows an RHEED diffraction image of the ZnO layer 11 without the heat treatment (anneal) after the growth process (T=T5 to T6) finished, that is, just after the growth. As shown in FIG. 3A, an RHEED diffraction image having streaks located at equal intervals was obtained. From this image, it was seen that the surface crystal arrangement is a single-crystal arrangement and is flat. Also, it was seen from AFM (atomic force microscope) measurement that Rms (root-mean-square roughness) for a 1 μm$^2$ area is 0.62 nm (nanometer). Since the c-axis length (lattice constant) c of a ZnO crystal is 5.207 Å, surface roughness is comparable to the c-axis length of the ZnO crystal. Hence it was seen that the crystal layer surface is flat. From these results, it was confirmed that the ZnO layer 11 is a single-crystal layer good in flatness.

FIG. 3B shows an RHEED diffraction image of the ZnO layer 11 on which heat treatment was performed at a temperature of 800° C. for three minutes after the growth. In the present embodiment, pressure Pa at the heat treatment was a low pressure (the same as at the crystal growth; Pa=Pg=10 kPa). Further, as mentioned above, while H$_2$O (water vapor) was being supplied to the substrate 10, that is, in a water vapor atmosphere, the heat treatment was performed.

As shown in FIG. 3B, it was ascertained that the RHEED diffraction image obtained after the heat treatment has further clear streaks than that obtained without the heat treatment (FIG. 3A). Also, it was seen from AFM measurement that Rms (root-mean-square roughness) is 0.5 nm or less and is less than or equal to the c-axis length of the ZnO crystal. Thus, it was confirmed that the single-crystal quality and flatness were improved by the heat treatment. Namely, the first single-crystal layer 11 is a thin film, but is a low-temperature grown single-crystal layer with flatness of the order of sub-nanometers.

As such, it was confirmed that the ZnO layer 11 already has good flatness and single-crystal quality after the crystal growth finishes and that the single-crystal quality is further improved by the heat treatment with the layer having flatness of less than or equal to the c-axis length of the ZnO crystal.

Although description has been made taking as an example the case of growing the ZnO layer as the first single-crystal layer 11, it may be another ZnO-based compound crystal.

[Growth Conditions for the Low-Temperature Grown Single-Crystal Layer (First Single-Crystal Layer) 11]

In the present embodiment, description has been made taking as an example the case of growing the ZnO layer (first single-crystal layer) 11 using an A-plane sapphire substrate, where the A-plane is the {11-20} plane of α-sapphire (α-Al$_2$O$_3$), as the substrate 10 and DMZn as the metalorganic compound material not containing oxygen, at a growth temperature of 400° C. at a growth pressure of 10 kPa at a growth rate of 1.7 nm/min, to be 25 nm thick.

However, conditions of the substrate, material gas, growth temperature, growth pressure, growth rate, grown-layer thickness, etc., cited in the present embodiment are shown only as an example, not being limited to these. The ZnO layer 11 was grown under various growth conditions including heat treatment conditions, and conditions for growing a single-crystal layer high in flatness were examined. Growth conditions of the ZnO layer (first single-crystal layer) 11 will be described in detail below.

<Substrate>

The A-plane sapphire substrate is most suitable. This is because the lattice mismatch between the A-plane of a sapphire crystal and the C-plane of a ZnO crystal is small. That is, the lattice mismatch between sapphire <0001> direction (oxygen atoms) and ZnO <11-20> direction (zinc atoms) is 0.07%, and the lattice mismatch between sapphire <10-10> direction (oxygen atoms) and ZnO <10-10> direction (zinc atoms) is 2.46%. Here, because the ZnO <11-20> direction is locked in alignment with the sapphire <0001> direction, a ZnO single crystal can be grown without 30° rotated domains being formed in the growth.

Further, as to usable substrates, for the ZnO crystal c-axis oriented on a substrate surface, a crystal substrate of which the substrate surface has lattice matching points at rotationally symmetric positions of 60°, 120°, and 180° is appropriate, and for the ZnO crystal a-axis or m-axis oriented, a crystal substrate where a lattice matching point exists at a rotationally symmetric position of 180° is appropriate. For example, an R-plane sapphire substrate, an M-plane sapphire substrate, a SiC (silicon carbide) substrate, a GaN (gallium nitride) substrate, a Ga$_2$O$_3$ (gallium oxide) substrate, a Si (silicon) substrate, or the like can be used.

<Growth Temperature>

It is suitable that the growth temperature is a temperature (called a "low growth temperature") lower than a crystal growth temperature (called a "high growth temperature") at which a ZnO single crystal is generally grown. This is because at the high growth temperature ZnO tends to grow like islands and not grow into a single crystal in the form of a layer.

More specifically, the growth temperature is preferably in the range of 250° C. to 450° C., more preferably in the range of 300° C. to 400° C. At temperatures lower than 250° C., ZnO tends to become amorphous or polycrystalline since its migration length is short. Further, as mentioned above, at temperatures higher than 450° C., ZnO tends to grow like islands, and thus flatness tends to decrease (the Rms value becomes larger).

<Growth Pressure>

The larger migration lengths of reactive chemical species (DMZn, H$_2$O, intermediate products, Zn atoms before crystallized, O atoms before crystallized, and the like) on the substrate surface are preferable for the single crystal growth. Thus, the reduced pressure growth is suitable. Specifically, a pressure of 1 kPa to 30 kPa is suitable, and a pressure of 5 kPa to 20 kPa is more preferable. If the growth pressure is 1 kPa or lower, the growth rate is significantly slow.

<Material Gas>

Forming a ZnO single-crystal layer under low growth pressure and low growth temperature requires the selection of highly interactive or reactive materials. This is because, if the reactivity is low, the layer fails to crystal-grow, or becomes amorphous or polycrystalline. As the Zn source, a metalorganic compound not containing oxygen in its constituent molecule and highly reactive with oxygen source material is suitable. Other than DMZn mentioned above, for example, DEZn (diethyl zinc) may be used. As the oxygen source, H$_2$O (water vapor) large in the polarization within the molecule and having high reactivity with the metalorganic compound material is suitable.

<Growth Rate>

The growth rate is preferably in the range of 0.4 nm/min to 9 nm/min, more preferably in the range of 0.8 nm/min to 4 nm/min. If the growth rate is larger than 9 nm/min, the surface bumps/dips or asperities may become large, resulting in insufficient flatness.

<Grown Layer Thickness>

The grown layer thickness should be in the range of 5 nm to 60 nm, preferably in the range of 10 nm to 40 nm, more preferably from 15 nm to 30 nm. That is, if the layer thickness is less than 5 nm, the crystal layer may fail to sufficiently cover the substrate surface. If the layer thickness is greater than 60 nm, the surface asperities may become large, resulting in insufficient flatness.

<VI/II Ratio ($F_{H2O}/F_{MO}$ Ratio)>

The ratio of the water vapor flow rate to the organic metal (DMZn) flow rate ($F_{H2O}/F_{DMZn}$ ratio) need only be about two or greater. Specifically, the ratio of about 2,000 will suffice. The water vapor flow rate should be up to about 70% of the saturation water vapor amount at which water vapor does not precipitate in the shower head.

<Heat Treatment Conditions>

As described above, the ZnO layer 11 already has good flatness and single-crystal quality after the crystal growth finishes, and the single-crystal quality and flatness can be further improved by the heat treatment. The heat treatment should be performed under low pressure that makes the migration length longer. The pressure range suitable for the heat treatment is the same as that of the growth pressure of the ZnO layer 11.

Specifically, it is suitable that the heat treatment temperature for the grown ZnO layer 11 is from 700° C. to 1,100° C. It is suitable that treatment time is from 1 to 60 minutes. It is more preferable that the treatment temperature is from 800° C. to 1,000° C. and that the treatment time is from 3 to 10 minutes. If the treatment temperature is lower than 700° C., the effect is too low, and if 1,100° C. or higher, the layer surface becomes rough. If the treatment time is 60 minutes or longer, film deficient portions may occur due to film vaporization.

[Growth Conditions of the ZnO-Based Semiconductor Layer (High-Temperature Grown Single-Crystal Layer or Second Single-Crystal Layer) 12]

The ZnO-based semiconductor layer (second single-crystal layer) 12 is grown on the ZnO layer (first single-crystal layer) 11 with flatness of the order of sub-nanometer and excellent in single-crystal quality using conditions for growth in a two-dimensional crystal growth mode (lateral growth mode).

In the present embodiment, description has been made taking as an example the case of growing the Mg$_x$Zn$_{(1-x)}$O crystal layer (second crystal layer) 12 on the ZnO layer 11 using water vapor and metalorganic compound material (DMZn) not containing oxygen, at the high growth temperature (800° C.) at a growth pressure of 80 kPa higher than that of the ZnO layer 11 at a growth rate of 17 nm/min, to be 1 μm thick.

However, conditions for growing the ZnO-based semiconductor layer 12 on the ZnO layer 11 cited in the present embodiment are shown only as an example, not being limited to these. The ZnO-based semiconductor layer was grown under various growth conditions, and conditions for growing the ZnO-based semiconductor layer 12 excellent in flatness and single-crystal quality were examined. As a result, it was found that the above ZnO layer 11 has slight but non-negligible fluctuation in crystallinity of a certain kind and that thus there are optimum conditions for crystal growth on the ZnO layer 11. Growth conditions for growing the ZnO-based semiconductor layer (second single-crystal layer) 12 on the ZnO layer (first single-crystal layer) 11 will be described in detail below.

<Growth Pressure>

Figure 4:
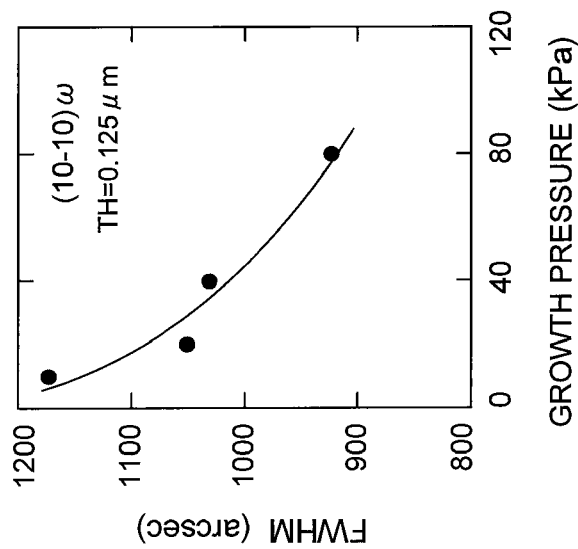
FIG. 4 shows the full width at half maximum (FWHM) of the X-ray diffraction (10-10) ω rocking curve of a ZnO layer (a second single-crystal layer) against growth pressure.

The relationship between the growth pressure and the crystallinity and flatness of the grown layer was evaluated. From the full width at half maximum (FWHM) (FIG. 4) of the X-ray diffraction (10-10) ω rocking curve of the ZnO layer (second single-crystal layer) 12 for the grown layer having a thickness (TH) of 0.125 μm, it was found that as the growth pressure increases, the crystallinity is improved. Also, it was found that as the growth pressure increases, the lateral growth (i.e., two-dimensional growth mode) is promoted, resulting in the plane (C-plane) orthogonal to the c-axis being flat. It was found that in order to obtain a flat crystal growth surface free of bumps/dips, asperities or pits as the surface of the ZnO-based semiconductor layer (second single-crystal layer) with good crystallinity, high growth pressure is desirable. Specifically, the growth pressure should be 40 kPa or higher, preferably 60 kPa or higher, more preferably 80 kPa or higher. The upper limit should be about 120 kPa. Note that this upper limit is that from the air tightness of the MOCVD apparatus, not from film forming conditions.

<Growth Temperature>

Figure 5:
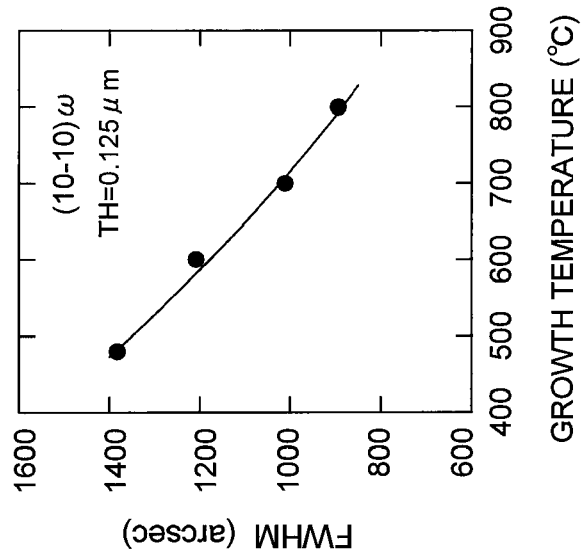
FIG. 5 shows the full width at half maximum (FWHM) of the X-ray diffraction (10-10) ω rocking curve of the ZnO layer (the second single-crystal layer) against growth temperature.

The relationship between the growth temperature and the crystallinity and flatness of the grown layer was evaluated. It was found that as the growth temperature increases, the full width at half maximum (FWHM) of the X-ray diffraction (10-10) ω rocking curve of the ZnO layer 12 having the grown layer thickness (TH) of 0.125 μm becomes narrower (FIG. 5), and that dislocation density decreases, thus improving the crystallinity and flatness. Specifically, the growth temperature should be 700° C. or higher at which a flat surface is formed in a c-axis direction. The upper limit is about 850° C. at which the layer can hardly grow with using H$_2$O (water vapor). The growth temperature is preferably in the range of 740° C. to 810° C., most preferably in the range of 780° C. to 810° C.

<Grown Layer Thickness>

Figure 6:
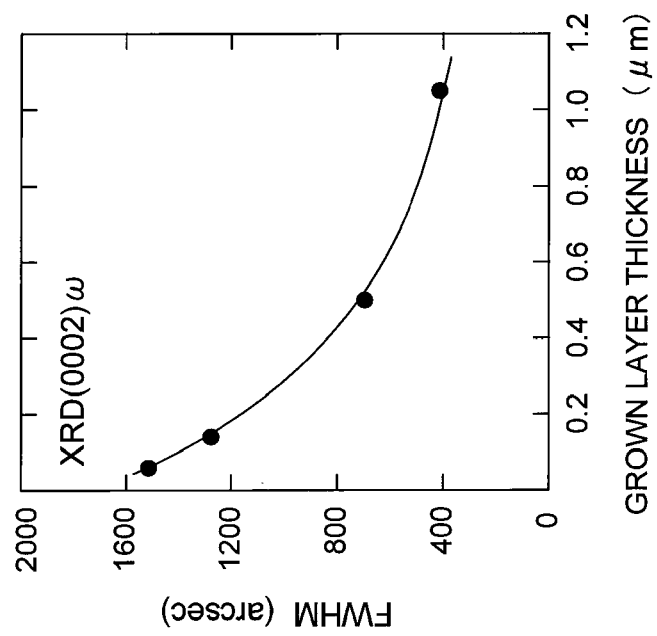
FIG. 6 shows the full width at half maximum (FWHM) of the X-ray diffraction (0002) ω rocking curve of a ZnO-based semiconductor layer (a high-temperature grown single-crystal layer) against grown layer thickness.

The relationship between the grown layer thickness and the crystallinity and flatness of the grown layer was evaluated. FIG. 6 shows the full width at half maximum (FWHM) of the X-ray diffraction (0002) ω rocking curve of the grown layer against the grown layer thickness. The ZnO-based semiconductor layer (second single-crystal layer) 12 that is formed on the ZnO layer (first single-crystal layer) 11 first grows like islands, and as time passes, single crystal islands merge into the ZnO-based semiconductor layer in the form of a layer.

Figure 7B:
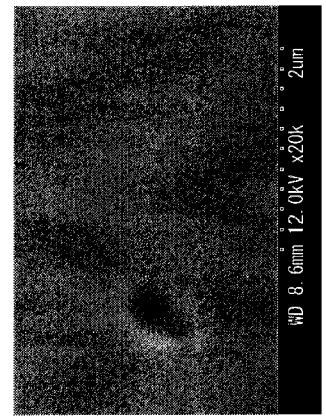
FIGS. 7A, 7B show scanning electron microscope (SEM) images of the ZnO layer (the second single-crystal layer) surface (grown layer thickness: 1.0 μm) for growth pressures of 10 kPa (7A) and 80 kPa (7B) respectively.
Figure 7A:
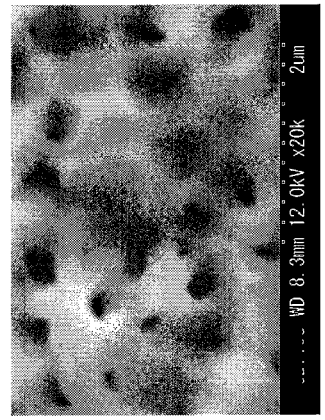

FIGS. 7A, 7B show scanning electron microscope (SEM) images of the grown layer surface of the ZnO layer 12 for growth pressures (Pg) of 10 kPa (FIG. 7A) and 80 kPa (FIG. 7B) respectively with the grown layer thickness being 1.0 μm. It can be seen that a crystal layer having good surface morphology and excellent in flatness is obtained when crystal growth is performed at a growth pressure of 80 kPa. Further, according to the X-ray diffraction rocking curve and scanning electron microscope (SEM) evaluations, it was found that the layer thickness is more preferably 1.5 μm or greater in order to obtain a crystal surface having extremely good single-crystal quality and flatness.

In order to grow a thick film having thickness of the micron order necessary for the device manufacture, a method is preferable where crystallinity tends to get better as the growth process proceeds. In this regard, it is understood, from FIGS. 6 and 7A, 7B, that the present invention is an excellent two-dimensional mode crystal growth method where crystallinity and flatness both get better as the growth proceeds.

<Growth Rate>

The growth rate is preferably in the range of 5 nm/min to 60 nm/min. If the growth rate is 60 nm/min or greater, abnormal growth is likely to occur.

<Crystal Composition>

For example, a $Mg_xZn_{(1-x)}O$ ($0 \leq x \leq 0.43$) crystal can be used as the ZnO-based semiconductor layer 12. However, as Mg composition x increases, the difference in lattice constant in an a-axis direction increases, resulting in an increase in the defect density of the grown semiconductor crystal layer. Hence, it is more preferable that x is set as $0 \leq x \leq 0.3$.

As mentioned above, the ZnO-based semiconductor layer 12 may be another ZnO-based compound crystal. For example, it may be a ZnO-based compound crystal having some of Zn (zinc) replaced by Ca, or a ZnO-based compound crystal having some of O (oxygen) replaced by Se, S, Te, or the like.

<Material Gas>

When grown at a high temperature, a ZnO crystal of high quality can be grown because the migration lengths of reactive chemical species on the crystal growth surface are sufficient. On the other hand, at a high temperature, gas material that is an oxygen source becomes hard to adsorb to the substrate surface, thus hindering the growth. As the oxygen source, $H_2O$ (water vapor) that has large polarization within the molecule, thus adsorbing even at high temperatures to the substrate surface is suitable.

As the Zn source, a metalorganic compound not containing oxygen and highly reactive with oxygen source material is suitable. Other than DMZn mentioned above, for example, DEZn (diethyl zinc) may be used. As the Mg source, Cp2Mg (biscyclopentadienyl magnesium) can be used.

<Growth Start Method>

Figure 8A:
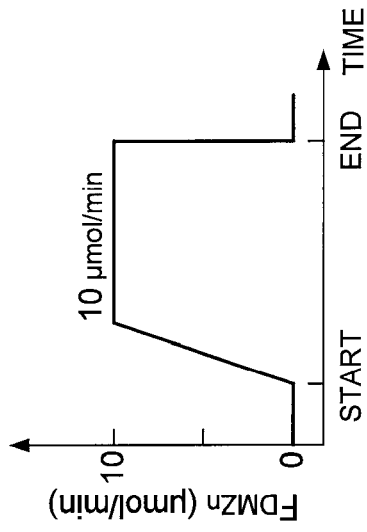
FIGS. 8A, 8B, 8C show schematically a growth start method for the ZnO-based semiconductor layer (the high-temperature grown single-crystal layer)
Figure 8B:
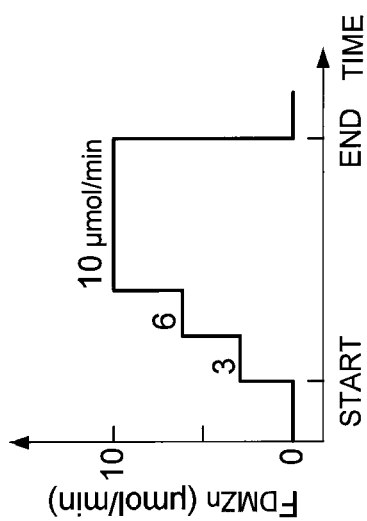
Figure 8C:
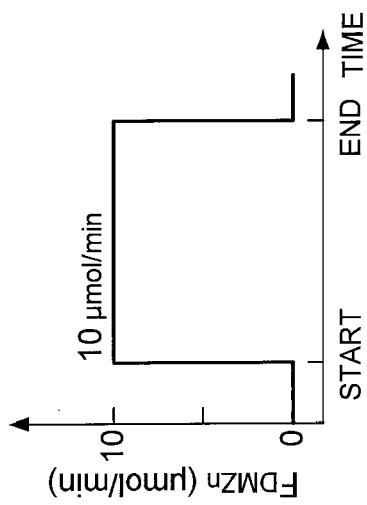

FIGS. 8A, 8B, 8C show schematically a growth start method for the ZnO-based semiconductor layer 12. FIG. 8A shows the case where the growth is performed with keeping the DMZn flow rate $F_{DMZn}$ constant from the growth start time (T=T9 in FIG. 2) to the growth end time (T=T10 in FIG. 2). Here, the case of the DMZn flow rate being 10 μmol/min is shown as an example.

FIG. 8B shows the case where the growth is performed with increasing the DMZn flow rate stepwise to 10 μmol/min. Specifically, the flow rate is at 3 μmol/min for 5 minutes, then at 6 μmol/min for 5 minutes, finally at 10 μmol/min to form the ZnO-based semiconductor layer (ZnO layer) 12 about 1 μm thick as in the case of FIG. 8A.

FIG. 8C shows the case where the growth is performed with increasing the DMZn flow rate linearly to 10 μmol/min in 10 minutes from the growth start and then keeping the flow rate constant. Also in this case, the ZnO-based semiconductor layer (ZnO layer) 12 about 1 μm thick is formed. Note that in the case of growing a crystal such as $Mg_xZn_{(1-x)}O$, the flow rate of organic metal gas (Cp2Mg, etc.) should be changed in the same way as the DMZn flow rate.

By increasing the DMZn flow rate stepwise or linearly in the beginning of the growth, the density of island-like crystals in the growth initial stage in the ZnO-based semiconductor layer 12 can be reduced. As a result, there is the effect that the flat thick film of the grown layer can be made thinner (for example, 1.5 μm or less).

<Dopants>

In order to adjust the conductivity type (n-type) of the ZnO-based semiconductor layer 12, one or more of TMGa (trimethyl gallium), TEGa (triethyl gallium), TMAl (trimethyl aluminum), TMIn (trimethyl indium), and TEIn (triethyl indium) need to be added. However, if added before island-like crystals merge and the crystal plane (C-plane) perpendicular to the c-axis becomes flat, they may hinder the surface from becoming flat, and hence, they are preferably doped during the last half of the growth time period in which the crystal surface becomes flat. Specifically, they are more preferably doped after the layer grows 1.0 μm thick. That is, it is preferable that the ZnO-based semiconductor layer 12 is an undoped layer at least 1.0 μm thick.

As described above in detail, by using the above growth conditions, the ZnO-based semiconductor layer 12 having high flatness and crystallinity can be grown on the first single-crystal layer 11 that is thin but excellent in flatness and single-crystal quality. That is, the ZnO-based semiconductor layer (second single-crystal layer) 12 can be grown to have enough thickness to be applied to device manufacture with having further high flatness and crystallinity, and hence can be applied widely to device manufacture. For example, a light emitting layer (or active layer), an LED light emitting operation layer, a clad layer of semiconductor laser devices, or a device operation layer of electronic devices or the like can be grown directly on the ZnO-based semiconductor layer 12. Or, the ZnO-based semiconductor layer 12 grown under the above growth conditions may be arranged to form part of an LED light emitting operation layer, a clad layer, or a device operation layer.

In this specification, the operation layer or device operation layer refers to a layer constituted by a semiconductor which a semiconductor device must include to fulfill its function. For example, for a simple transistor, a structured layer constituted by pn junctions of an n-type semiconductor, a p-type semiconductor, and an n-type semiconductor (or a p-type semiconductor, an n-type semiconductor, and a p-type semiconductor) are included. A semiconductor layer constituted by a p-type semiconductor layer, a light emitting layer, and an n-type semiconductor layer (or a p-type semiconductor layer and an n-type semiconductor layer) and emitting light through the recombination of injected carriers is called a light emitting operation layer.

[With-Grown-Layer Substrate 15]

The with-grown-layer substrate 15 obtained through the above processes can be subsequently used in the MOCVD apparatus to manufacture a semiconductor device without being cooled. Or, after cooled, semiconductor devices may be manufactured using the MOCVD apparatus or another crystal growing apparatus.

That is, with the with-grown-layer substrate 15, a single crystal can be grown directly on the single-crystal layer (ZnO-based semiconductor layer 12) excellent in single-crystal quality and flatness using the MOCVD apparatus or another crystal growing apparatus. Thus, a high quality ZnO-based semiconductor layer having a small numbers of crystal defects and low defect density, and excellent in single-crystal quality and flatness can be formed.

Further, with the with-grown-layer substrate 15, optical semiconductor devices, various electronic devices, and the like can be formed by various methods other than MOCVD such as MBE, plasma CVD, PLD (Pulsed Laser Deposition), and hydride VPE.

As such, according to the present invention, there is provided a with-grown-layer substrate having formed thereon high quality single-crystal layers having a small number of crystal defects and excellent in single-crystal quality and flatness which is applicable to the manufacture of optical semiconductor devices and various electronic devices.

Embodiment 2

Figure 9:
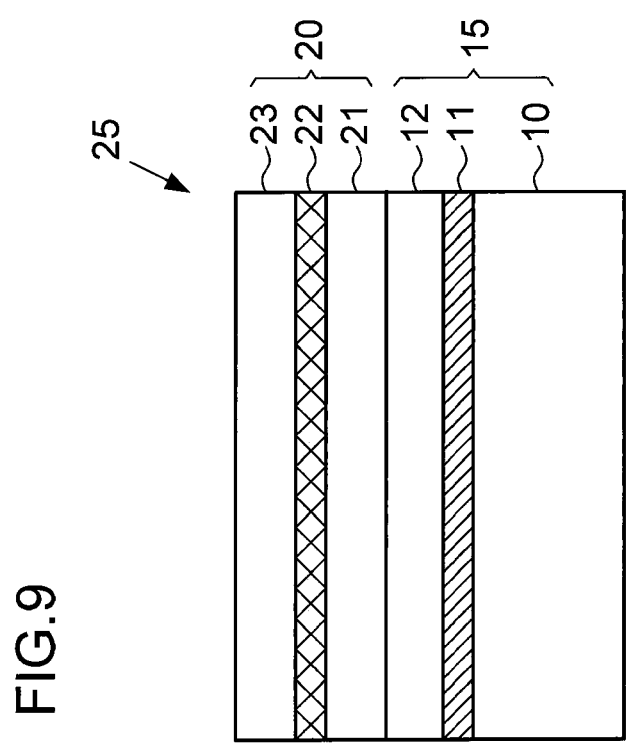
FIG. 9 is a schematic cross-sectional view of a semiconductor light emitting device structure grown on a substrate according to the present invention.

FIG. 9 is a cross-sectional view of a semiconductor light emitting device structure grown on the substrate 10 according to the present invention. More specifically, a light emitting operation layer (hereinafter also called an LED operation layer) 20 including an n-type ZnO-based semiconductor layer 21, a ZnO-based semiconductor active layer 22, and a p-type ZnO-based semiconductor layer 23 was formed on the with-grown-layer substrate 15 having the ZnO layer 11 and the ZnO-based semiconductor layer 12 formed thereon according to the above-described embodiment. Crystal growth conditions of the LED operation layer 20 were the same as those of the ZnO-based semiconductor layer 12 unless otherwise noted. That is, the crystal growth sequence was the same as that shown in FIG. 2, and using the same growth temperature, growth pressure, material gas, etc., as in the period (G2) of T=T9 to T10, the n-type ZnO-based semiconductor layer 21, ZnO-based semiconductor active layer 22, and p-type ZnO-based semiconductor layer 23 were sequentially formed on the ZnO-based semiconductor layer 12. Growth conditions such as growth temperature and growth pressure of the LED operation layer 20 may not necessarily be the same as those of the ZnO-based semiconductor layer 12. That is, crystal growth conditions of the LED operation layer 20 are preferably within the ranges of those of the ZnO-based semiconductor layer 12.

As such, by growing an LED operation layer on the ZnO-based semiconductor layer 12 having good flatness and single-crystal quality under growth conditions similar to those of the ZnO-based semiconductor layer 12, the LED operation layer flat and excellent in crystallinity can be formed. Description will be made below taking as an example the case of growing $Mg_xZn_{(1-x)}O$ as the ZnO-based semiconductor.

After an undoped ZnO-based semiconductor layer 12 was grown, with maintaining the growth temperature and growth pressure (800° C., 80 kPa) the n-type ZnO-based semiconductor layer 21 was grown. The undoped ZnO-based semiconductor layer 12 is preferably at least 1.0 μm thick as mentioned above.

Keeping the $H_2O$ (water vapor) flow rate at 640 μmol/min and increasing the DMZn flow rate from 10 μmol/min to 30 μmol/min, a Ga-doped $Mg_xZn_{(1-x)}O$ crystal 3 μm thick was grown. The flow rate of Mg material gas (Cp2Mg) should be adjusted according to Mg crystal composition x.

In order to control the conductivity type (n-type), TEGa was doped during the $Mg_xZn_{(1-x)}O$ crystal growth so that its concentration in the $Mg_xZn_{(1-x)}O$ crystal became $5\times10^{18}$ ($cm^{-3}$).

Then, the DMZn flow rate was decreased to 1 μmol/min, and the active layer 22 ($Mg_xZn_{(1-x)}O$ crystal) 30 nm thick was grown. Here, by decreasing the DMZn flow rate, the ratio of the $H_2O$ (water vapor) flow rate to the DMZn flow rate (VI/II ratio) was increased from 21 to 640. Thereby, deficiency of oxygen or the like in the grown layer could be reduced, and thus high light-emission efficiency could be obtained.

Then, the p-type ZnO-based semiconductor layer 23 was grown. Specifically, at a DMZn flow rate of 1 μmol/min, an N (nitrogen)-doped $Mg_xZn_{(1-x)}O$ crystal 100 nm thick was grown. Here, during the $Mg_xZn_{(1-x)}O$ crystal growth, $NH_3$ (ammonia) was supplied as p-type impurity material (dopant) at a flow rate of 180 μmol/min so that nitrogen impurity concentration Na (N) became $8\times10^{19}$ $cm^{-3}$.

After the above process finished, the pressure was maintained at 80 kPa with keeping water vapor flowing until the substrate temperature became 300° C. After the substrate temperature became 300° C. or lower, water vapor was stopped, and the substrate was taken out of the reaction chamber after the substrate temperature became room temperature.

The case of using $Mg_xZn_{(1-x)}O$ crystals as the n-type ZnO-based semiconductor layer 21, active layer 22, and p-type ZnO-based semiconductor layer 23 has been described.
In this case,
n-type ZnO-based semiconductor layer 21: $Mg_xZn_{(1-x)}O$ (0≦x≦0.43);
p-type ZnO-based semiconductor layer 23: $Mg_xZn_{(1-x)}O$ (0≦x≦0.43); and
active layer 22: $Mg_xZn_{(1-x)}O/Mg_yZn_{(1-y)}O$ (0≦(x, y)≦0.43; y<x) can be used.

Here, Mg crystal composition x should be 0.63 or less for a layer thickness of about 0.5 μm or less and 0.43 or less for 0.5 μm or greater. This is because if the Mg composition is higher, the phase separation of MgO occurs in the MgZnO crystal.

Each of the n-type ZnO-based semiconductor layer 21, the active layer 22, and the p-type ZnO-based semiconductor layer 23 may be of a multilayered structure depending on the light emitting device characteristics. Further, the active layer 22 may be of an MQW (Multi-quantum well) structure. Especially in the case of an MQW active layer, variation in the thickness of crystal layers (a well layer, a barrier layer) varies quantum state energy, quantum state density, and the like, thus greatly affecting the emission wavelength, internal quantum efficiency, and the like, and hence the effect produced by using the ZnO-based semiconductor layer 12 excellent in flatness and single-crystal quality is further remarkable.

A with-LED-operation-layer substrate 25 that was manufactured through the above-described process was evaluated with a differential interference microscope and a scanning electron microscope (SEM). As a result, it was ascertained that the surface was free of bumps/dips or pits and was an extremely flat and mirror-like in macroscopic to microscopic views.

[Manufacture of Semiconductor Light Emitting Device]

Semiconductor light emitting devices (LEDs) were manufactured using the with-LED-operation-layer substrate 25 produced through the above process, through the following processes. FIG. 10 is a top plan view of a semiconductor light emitting device (LED) 30, and FIG. 11 is a cross-sectional view of LEDs 30. FIG. 11 shows that two LEDs 30 and a device partition groove 32 for separating these by breaking process are formed.

First, a resist mask of a shape covering an area (i.e., device area) in a device section 31 was formed using photolithography technology. Then, portions of the p-type ZnO-based semiconductor layer 23, the active layer 22, and the n-type ZnO-based semiconductor layer 21 under the opening outside the device section 31 were removed and etched down to a predetermined depth using wet etching. Finally, the resist was removed to form the device partition groove 32.

The surface of the with-LED-operation-layer substrate 25 of the present invention is flat and mirror-like entirely on the substrate (e.g., a two inch substrate), and hence a resist can be coated to have uniform thickness. Further, because the surface is free of bumps/dips, in the photolithography process, a pattern can be transferred with good accuracy without exposure halation of the transferred pattern.

Then, a p-side electrode 33 was formed using photolithography, EB (electron beam) vapor deposition, and so on. As to the p-side electrode 33, a Ni (nickel) film 0.3 to 10 nm thick and an Au (gold) film 5 to 20 nm thick were formed, and a process at 500° C. for 30 seconds was performed in a 10% oxygen atmosphere in an RTA (rapid thermal annealer) to make it a transparent electrode.

Next, Ni, Pt, and Au electrode pad materials were laid one over another in that order to be respectively 3 to 10 nm, 100 nm, and 1,000 nm thick on the p-side electrode 33 to form a p-side connection electrode 34.

Further, Ti and Au were laid one over the other in that order by EB vapor deposition to be respectively 10 to 100 nm and 1,000 nm thick on a surface of the n-type ZnO-based semiconductor layer 21 exposed by photolithography to form an n-side connection electrode 35.

After the electrodes were formed in this way, the substrate 25 was stuck at the LED operation layer side to a protection substrate, and the back side was grinded and polished to be shaped into a wafer 100 μm thick. Next, after a protection sheet was stuck to the electrode-formed surface side, scribe grooves 36 orthogonal to each other were formed in the back side to be opposite the center of the device partition grooves 32 with a scribe apparatus.

In the breaking process, a knife edge 37 was pressed against the bottom of the device partition groove 32 opposite the scribe groove 36, and a load was applied with the knife edge 37 to cleave the substrate along a scribe groove. Likewise, the substrate was rotated through 90° and cleaved along the scribe groove 36 orthogonal to the former one.

Because the surface of the with-LED-operation-layer substrate 25 of the present invention was free of bumps/dips or asperities, the bottom of the device partition groove 32 was also formed extremely flat, and pressure could be accurately applied to the partition groove bottom with the knife edge 37. Thus, when applying pressure to cleave, stress was uniformly applied, and hence the occurrences of cleavage failure due to device section chipping, the deviation of a cleaved surface, etc., could be reduced, improving the cleavage yield. Further, without a potential crystal grain boundary (domain) in crystal planes, when cleaving, chips in a crystal layer due to a grain boundary decreased in number, improving the separation yield.

When devices were formed using the with-LED-operation-layer substrate 25 of the present invention, a resist pattern formation yield was about 98%. Also, the cleavage yield was extremely good, about 98%.

As described above, because an LED operation layer is grown on the ZnO-based semiconductor layer 12 that is a high quality single crystal layer having a small number of crystal defects and excellent in single-crystal quality and flatness, the LED operation layer flat and excellent in crystallinity can be formed, and high performance LEDs having leak current and current concentration suppressed and thus high in light-emission efficiency and excellent in device lifetime can be manufactured. Further, high process accuracy in semiconductor processes such as lithography and etching can be obtained, and the production yield in cleavage, breaking, and like is also high.

As described above in detail, according to the present invention, using metalorganic compound material not containing oxygen together with $H_2O$ (water vapor) having high reactivity with the metalorganic compound material, a zinc oxide single-crystal layer (first single-crystal layer) can be grown at a low growth temperature and a low growth pressure on a substrate of another material substrate such as an A-plane sapphire substrate. Further, by performing heat treatment under low pressure (reduced pressure) in a water vapor atmosphere, the single-crystal quality and flatness of the grown layer can be further improved. The single-crystal layer is excellent in flatness and single-crystal quality and also has a small number of crystal defects. Moreover, because the MOCVD method is used, large area growth and multi-wafer growth are possible. Thus, the present method is excellent in mass productivity and production costs.

Furthermore, the ZnO-based compound semiconductor layer having further high flatness and crystallinity can be grown on the ZnO layer (first single-crystal layer) 11 excellent in flatness and single-crystal quality. The ZnO-based compound semiconductor layer (second single-crystal layer) 12 can be grown to have enough thickness to be applied to device manufacture as well as high flatness and crystallinity. Therefore, an LED light emitting operation layer, a clad layer of semiconductor laser devices, a device layer of electronic devices, or the like can be grown directly on the ZnO-based semiconductor layer 12.

By growing an LED operation layer on the ZnO-based semiconductor layer 12, the LED operation layer flat and excellent in crystallinity can be formed, and high output power, high performance LEDs having leak current and current concentration suppressed and thus high in light-emission efficiency can be provided. Further, LEDs excellent in device lifetime can be manufactured. Yet further, high accuracy in semiconductor processes is obtained, and the production yield in cleavage, breaking, and like is also high.

Embodiment 3

Figure 12:
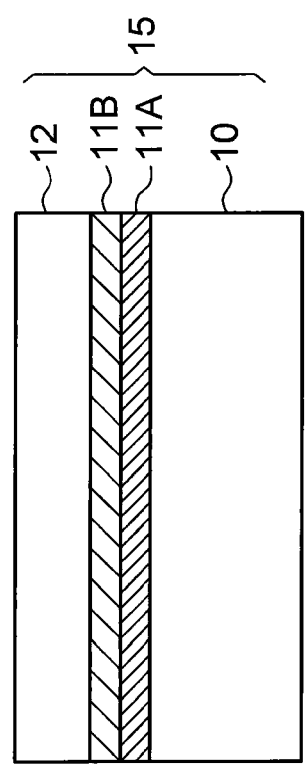
FIG. 12 is a cross-sectional view showing first and second low-temperature grown crystal layers and a ZnO-based semiconductor layer grown on the substrate according to the present invention.

FIG. 12 is a cross-sectional view of a zinc-oxide-based semiconductor crystal layer grown on the substrate 10 according to the present invention. More specifically, a first ZnO layer 11A, a second ZnO layer 11B, and a ZnO-based semiconductor layer 12 are formed on a sapphire substrate using the MOCVD method. Description will be made below taking as an example the case of growing $Mg_xZn_{(1-x)}O$ ($0 \leq x \leq 0.68$) as the ZnO-based semiconductor layer 12.

Figure 13:
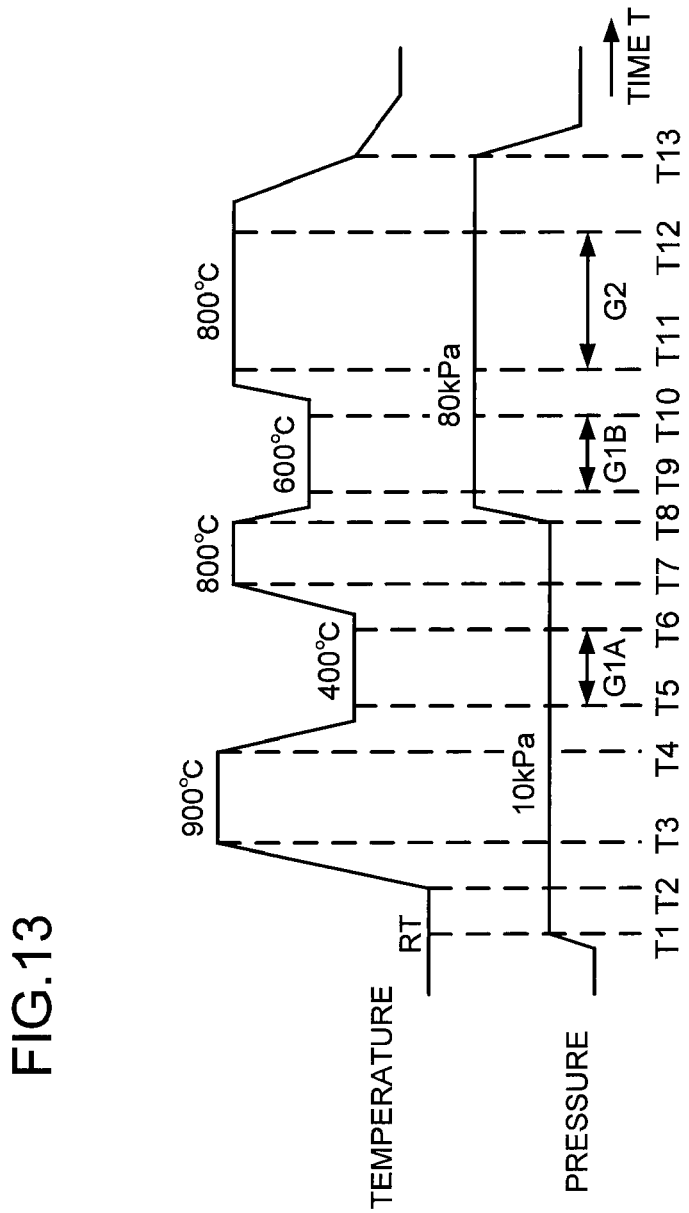
FIG. 13 shows a crystal growth sequence used in crystal growth by the MOCVD method.

FIG. 13 shows a crystal growth sequence used in crystal growth by the MOCVD method. First, the A-plane sapphire substrate 10 was set on the susceptor in the MOCVD apparatus, and the reaction chamber pressure was adjusted to 10 kPa (kilopascals) (time T=T1).

Next, $H_2O$ (water vapor) as an oxygen source started to be supplied from the shower head to the substrate 10 at a flow rate of 640 μmol/min (T=T2). Further, the substrate 10 was raised in temperature by the heater from room temperature (RT) to 900° C. to perform the degassing of the substrate 10 for 10 minutes (T=T3 to T4). Thereafter, $H_2O$ (water vapor) was kept flowing at the same flow rate until the growth finished.

After the degassing, the substrate temperature was lowered to 400° C. (first low growth temperature), and DMZn (dimethyl zinc) as zinc material was supplied to the substrate 10 at a flow rate of 1 μmol/min for about 15 minutes (T=T5 to T6: the growth period of the first ZnO layer 11A indicated by period G1A in FIG. 13). At this time, the ratio of the water vapor flow rate to the organic metal (DMZn) flow rate ($F_{H_2O}/F_{DMZn}$ ratio), a so-called VI/II ratio, was at 640.

As such, the ZnO layer (first low-temperature grown single-crystal layer, hereinafter also simply called a first single-crystal layer) 11A of 25 nm thickness was grown under a reduced pressure growth condition (i.e., growth pressure Pg=10 kPa) at a growth temperature (Tg) of 400° C. at a growth rate of 1.7 nm/min.

After the growth of the ZnO layer 11A, the substrate temperature was raised to 800° C. to perform heat treatment (annealing) for three minutes (T=T7 to T8). As described later, the crystallinity and flatness of the ZnO layer 11A were further improved by the heat treatment.

After the heat treatment (annealing) of the first ZnO layer (first low-temperature grown single-crystal layer) 11A finished, the second ZnO layer 11B was grown at a higher temperature and a higher pressure than those of the first ZnO layer 11A. That is, the substrate temperature was lowered from the heat treatment temperature (800° C.) to 600° C. (second low growth temperature) higher than the first low growth temperature. Further, the reaction chamber pressure was increased from 10 kPa (low growth pressure) to 80 kPa (high growth pressure). After the substrate temperature became stable, DMZn was supplied from the shower head onto the ZnO layer 11A at a flow rate of 10 μmol/min (T=T9 to T10: the growth period of the second ZnO layer 11B indicated by the period G1B in FIG. 13). At this time, the ratio of the water vapor flow rate to the organic metal (DMZn) flow rate ($F_{H2O}/F_{MO}$ ratio), the so-called VI/II ratio, was at 64. DMZn was supplied for about 2.5 minutes to form a 40 nm thick second ZnO layer (second low-temperature grown single-crystal layer, hereinafter also simply called a second single-crystal layer) 11B at a growth rate of 16 nm/min.

After the growth of the second ZnO layer 11B finished, the ZnO-based semiconductor layer 12 was grown at a higher temperature (high growth temperature) than that of the second ZnO layer (second single-crystal layer) 11B. That is, the substrate temperature was raised from 600° C. (second low growth temperature) to 800° C. (high growth temperature) with maintaining the reaction chamber pressure at 80 kPa. After the substrate temperature became stable, DMZn was supplied from the shower head onto the ZnO layer 11B at a flow rate of 10 μmol/min (T=T11 to T12: the growth period of the ZnO-based semiconductor layer 12 indicated by the period G2 in FIG. 13). At this time, the ratio of the water vapor flow rate to the organic metal (DMZn) flow rate ($F_{H2O}/F_{MO}$ ratio), the so-called VI/II ratio, was at 64. DMZn was supplied to the substrate 10 for about 60 minutes to form the ZnO-based semiconductor layer (ZnO layer) 12 about 1 μm thick at a growth rate of 17 nm/min.

Note that the standby time until the substrate temperature becomes stable before the growth of the ZnO-based semiconductor layer 12 can be shared with the heat treatment of the second ZnO layer 11B.

As such, the ZnO-based semiconductor layer 12 (high-temperature grown single-crystal layer, hereinafter also called a third single-crystal layer) about 1 μm thick was grown at a higher growth temperature (800° C.) than that of the second ZnO layer 11B at a growth rate of 17 nm/min. In this embodiment, description is made taking as an example the case of growing ZnO as the ZnO-based semiconductor layer 12, but not being limited to this, a $Mg_xZn_{(1-x)}O$ crystal, a ternary crystal, may be grown by using, e.g., Cp2Mg (bis-cyclopentadienyl magnesium) that is a metalorganic compound not containing an oxygen atom either, as well as DMZn.

After the growth of the ZnO-based semiconductor layer 12 finished, the substrate was cooled with keeping water vapor flowing. After the substrate temperature became 300° C. or lower, the supply of the water vapor was stopped (T=T13).

As described above, a with-crystal-grown-layer substrate (hereinafter simply called a with-grown-layer substrate) 15 that is the substrate having the first ZnO layer (first single-crystal layer) 11A, the second ZnO layer (second single-crystal layer) 11B, and the ZnO-based semiconductor layer (third single-crystal layer) 12 grown thereon was produced.

[Crystallinity of the First ZnO Layer (First Low-Temperature Grown Single-Crystal Layer) 11A]

The first ZnO layer (first single-crystal layer) 11A obtained through the above growth process (T=T5 to T6) is a single-crystal layer c-axis-oriented on the A-plane ({11-20} plane) sapphire substrate. That is, the {0001} plane of a zinc oxide single crystal is laid on a substrate of an α-sapphire single crystal with the {11-20} plane as the main plane. The single-crystal quality and flatness of the ZnO layer 11A were examined by RHEED (reflection high energy electron diffraction) measurement and AFM (atomic force microscope) measurement.

Figure 14A:
FIGS. 14A and 14B show RHEED diffraction images of a first ZnO layer for the cases of performing no heat treatment thereon after grown and of performing heat treatment, respectively.

FIG. 14A shows an RHEED diffraction image of the ZnO layer 11A without the heat treatment (anneal) after the growth process (T=T5 to T6) finished, that is, just after the growth. As shown in FIG. 14A, an RHEED diffraction image having streaks located at equal intervals was obtained. From this, it was seen that the surface crystal arrangement is a single-crystal arrangement and flat. Also, it was seen from AFM (atomic force microscope) measurement that Rms (root-mean-square roughness) for a 1 μm$^2$ area is 0.62 nm (nanometers). Since the c-axis length (lattice constant) of a ZnO crystal is 5.207 Å, surface roughness is on the order of the c-axis length of the ZnO crystal. Hence it was seen that the crystal layer surface is flat. From these results, it was confirmed that the ZnO layer 11A is a single-crystal layer good in flatness.

Figure 14B:
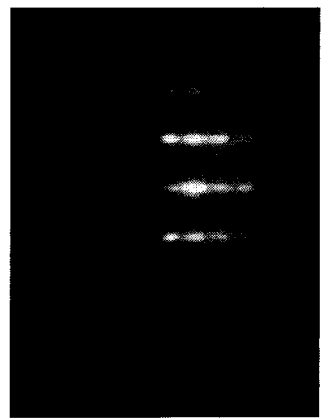

FIG. 14B shows an RHEED diffraction image of the ZnO layer 11A on which heat treatment was performed at a temperature of 800° C. for three minutes after the growth. In the present embodiment, the pressure Pa at the heat treatment was a low pressure (the same as at the crystal growth; Pa=Pg=10 kPa). Further, as mentioned above, while $H_2O$ (water vapor) was being supplied to the substrate 10, that is, in a water vapor atmosphere, the heat treatment was performed.

As shown in FIG. 14B, it was ascertained that the RHEED diffraction image obtained after the heat treatment shows further clear streaks than that obtained without the heat treatment (FIG. 14A). Also, it was seen from AFM measurement that Rms (root-mean-square roughness) is 0.5 nm or less and less than or equal to the c-axis length of the ZnO crystal. Thus, it was confirmed that the single-crystal quality and flatness were improved by the heat treatment. Namely, the first single-crystal layer 11A is a thin film, but is a low-temperature grown single-crystal layer with flatness of the order of sub-nanometers.

As such, it was confirmed that the ZnO layer 11A already had good flatness and single-crystal quality after the crystal growth finishes and that the single-crystal quality is further improved by the heat treatment with the layer having flatness of less than or equal to the c-axis length of the ZnO crystal.

Although description has been made taking as an example the case of growing the ZnO layers as the first single-crystal layer 11A and the second single-crystal layer 11B, they may be another ZnO-based compound crystal.

[Growth Conditions of the First Low-Temperature Grown Single-Crystal Layer 11A]

In the present embodiment, description has been made taking as an example the case of growing the first ZnO layer (first single-crystal layer) 11A using an A-plane sapphire substrate, where the A-plane is the {11-20} plane of an α-sapphire ($\alpha$-$Al_2O_3$), as the substrate 10 and DMZn as metalorganic compound material not containing oxygen, at a growth temperature of 400° C. at a growth pressure of 10 kPa at a growth rate of 1.7 nm/min, to be 25 nm thick.

However, conditions of the substrate, material gas, growth temperature, growth pressure, growth rate, grown-layer thickness, etc., cited in the present embodiment are shown only as an example, not being limited to these. The ZnO layer 11A was grown under various growth conditions including heat treatment conditions, and conditions for growing a single-crystal layer high in flatness were examined. Growth conditions of the first ZnO layer (first single-crystal layer) 11A will be described in detail below.

<Substrate>

The A-plane sapphire substrate is most suitable. This is because the lattice mismatch between the A-plane of a sapphire crystal and the C-plane of a ZnO crystal is small. That is, the lattice mismatch between sapphire <0001> direction (oxygen atoms) and ZnO <11-20> direction (zinc atoms) is 0.07%, and the lattice mismatch between sapphire <10-10> direction (oxygen atoms) and ZnO <10-10> direction (zinc atoms) is 2.46%. Here, because the ZnO <11-20> direction is locked in alignment with the sapphire <0001> direction, a ZnO single crystal can be grown without 30° rotated domains being formed in the growth.

Further, as to usable substrates, for the ZnO crystal c-axis oriented on a substrate surface, a crystal substrate of which the substrate surface has lattice matching points at rotationally symmetric positions of 60°, 120°, and 180° is appropriate, and for the ZnO crystal a-axis or m-axis oriented, a crystal substrate where a lattice matching point exists at a rotationally symmetric position of 180° is appropriate. For example, an R-plane sapphire substrate, an M-plane sapphire substrate, a SiC (silicon carbide) substrate, a GaN (gallium nitride) substrate, a $Ga_2O_3$ (gallium oxide) substrate, a Si (silicon) substrate, or the like can be used.

<Growth Temperature>

It is suitable that the growth temperature is a temperature ("low growth temperature") lower than a crystal growth temperature ("high growth temperature") at which a ZnO single crystal is generally grown. This is because at the high growth temperature ZnO tends to grow like islands and not grow into a single crystal in the form of a layer.

More specifically, the growth temperature is preferably in the range of 250° C. to 450° C., more preferably in the range of 300° C. to 400° C. At temperatures of 250° C. and lower, because its migration length is short, ZnO tends to become amorphous or polycrystalline. Further, as mentioned above, at temperatures of 450° C. and higher, ZnO tends to grow like islands, and thus flatness tends to decrease (the Rms value becomes larger).

<Growth Pressure>

The larger migration lengths of reactive chemical species (DMZn, $H_2O$, intermediate products, Zn atoms before crystallized, O atoms before crystallized, and the like) on the substrate surface are preferable for the single crystal growth. Hence, the reduced pressure growth is suitable. Specifically, a pressure of 1 kPa to 30 kPa is suitable, and a pressure of 5 kPa to 20 kPa is more preferable. If the growth pressure is 1 kPa or lower, the growth rate is significantly slow.

<Material Gas>

Forming a ZnO single-crystal layer under low growth pressure and low growth temperature requires the selection of highly reactive materials. This is because, if the reactivity is low, the layer fails to crystal-grow, or becomes amorphous or polycrystalline. As the Zn source, a metalorganic compound not containing oxygen in its constituent molecule and highly reactive with oxygen source material is suitable. Other than DMZn mentioned above, for example, DEZn (diethyl zinc) may be used. As the oxygen source, $H_2O$ (water vapor) large in the polarization within the molecule and having high reactivity with the metalorganic compound material is suitable.

<Growth Rate>

The growth rate is preferably in the range of 0.4 nm/min to 9 nm/min, more preferably in the range of 0.8 nm/min to 4 nm/min. If the growth rate is 9 nm/min or greater, the surface bumps/dips or asperities may become large, resulting in insufficient flatness.

<Grown Layer Thickness>

The grown layer thickness should be in the range of 5 nm to 60 nm, preferably in the range of 10 nm to 40 nm, more preferably from 15 nm to 30 nm. That is, if the layer thickness is less than 5 nm, the crystal layer may fail to sufficiently cover the substrate surface. If 60 nm or greater, the surface asperities may become large, resulting in insufficient flatness.

<VI/II Ratio ($F_{H2O}/F_{MO}$ Ratio)>

The ratio of the water vapor flow rate to the organic metal (DMZn) flow rate ($F_{H2O}/F_{MO}$ ratio) need only be about two or greater. Specifically, the ratio of about 2,000 will suffice. The water vapor flow rate should be up to about 70% of the saturation water vapor amount at which water vapor does not precipitate in the shower head.

<Heat Treatment Conditions>

As described above, the ZnO layer 11A already has good flatness and single-crystal quality after the crystal growth finishes, and the single-crystal quality and flatness can be further improved by the heat treatment. The heat treatment should be performed under low pressure that makes the migration length longer. The pressure range suitable for the heat treatment is the same as that of the growth pressure of the ZnO layer 11A.

Specifically, it is suitable that the heat treatment temperature for the grown ZnO layer 11A is from 700° C. to 1,100° C. It is suitable that treatment time is from 1 to 60 minutes. It is more preferable that the treatment temperature is from 800° C. to 1,000° C. and that the treatment time is from 3 to 10 minutes. If the treatment temperature is lower than 700° C., the effect is low, and if 1,100° C. or higher, the layer surface becomes rough. If the treatment time is 60 minutes or longer, film deficient portions may occur due to film vaporization.

[Growth Conditions of the Second Low-Temperature Grown Single-Crystal Layer 11B]

<Growth Temperature>

The growth temperature is preferably from 500° C. to 600° C. to form ZnO in the form of a uniform layer on the ZnO layer 11A. If the growth temperature is lower than 500° C., crystallinity will not suffice, and thus heat treatment will be necessary. If 650° C. or higher, ZnO will grow like islands on the ZnO layer 11A.

<Growth Pressure>

For the second ZnO layer (second low-temperature grown single-crystal layer) 11B, the growth pressure of 40 kPa to 120 kPa is suitable. This is because the lateral growth (two-dimensional growth mode) is promoted, resulting in the grown layer being flat. Note that this upper limit is that from the air tightness of the MOCVD apparatus, not from film forming conditions.

<Grown Layer Thickness>

For the second ZnO layer (second single-crystal layer) 11B, the layer thickness of 5 nm to 80 nm is suitable. If less than 5 nm thick, the layer will not sufficiently cover the ZnO layer 11A. If greater than 80 nm thick, hillocks will occur. The layer thickness is more preferably from 20 nm to 60 nm.

<Growth Rate>

The growth rate should be 60 nm/min or less, preferably in the range of 5 nm/min to 60 nm/min. This is for preventing the occurrence of abnormal growth.

[Growth Conditions of the ZnO-Based Semiconductor Layer (High-Temperature Grown Single-Crystal Layer) 12]

The ZnO-based semiconductor layer (high-temperature grown single-crystal layer, also called a third single-crystal layer) 12 is grown on the second ZnO layer (second single-crystal layer) 11B having flatness of the order of sub-nanometers and excellent in single-crystal quality using conditions for growth in a two-dimensional crystal growth mode (or lateral growth mode).

In the present embodiment, description has been made taking as an example the case of growing the $Mg_xZn_{(1-x)}O$ crystal layer (high-temperature grown single-crystal layer) 12 on the ZnO layer 11B using water vapor and metalorganic compound material (DMZn) not containing oxygen, at the high growth temperature (800° C.) at a growth pressure of 80 kPa higher than that of the ZnO layer 11A, like for the ZnO layer 11B, at a growth rate of 17 nm/min to be 1 µm thick.

However, conditions for growing the ZnO-based semiconductor layer 12 on the ZnO layer 11B cited in the present embodiment are shown only as an example, not being limited to these. The ZnO-based semiconductor layer was grown under various growth conditions, and conditions for growing the ZnO-based semiconductor layer 12 excellent in flatness and single-crystal quality were examined. Growth conditions for growing the ZnO-based semiconductor layer (third single-crystal layer) 12 on the second ZnO layer (second single-crystal layer) 11B will be described in detail below.

<Growth Pressure>

It was found that as the growth pressure increases, the crystallinity is improved. That is, it was found that as the growth pressure increases, the lateral growth (two-dimensional growth mode) is promoted, resulting in the plane (C-plane) orthogonal to the c-axis being flat. It was found that in order to obtain a flat crystal growth surface free of bumps/dips or pits as the surface of the ZnO-based semiconductor layer (high-temperature grown single-crystal layer) with good crystallinity, high growth pressure is desirable. Specifically, the growth pressure is preferably 40 kPa or higher, more preferably 60 kPa or higher, further more preferably 80 kPa or higher. The upper limit should be about 120 kPa. Note that this upper limit is that from the airtightness of the MOCVD apparatus, not from film forming conditions.

<Growth Temperature>

It was found that as the growth temperature increases, dislocation density decreases, and thus the crystallinity and flatness are improved. Specifically, the growth temperature should be 700° C. or higher at which a flat surface is formed in a c-axis direction. The upper limit is about 850° C. at which the layer can hardly grow when using $H_2O$ (water vapor). The growth temperature is preferably in the range of 740° C. to 810° C., most preferably in the range of 780° C. to 810° C.

<Grown Layer Thickness>

Figure 15:
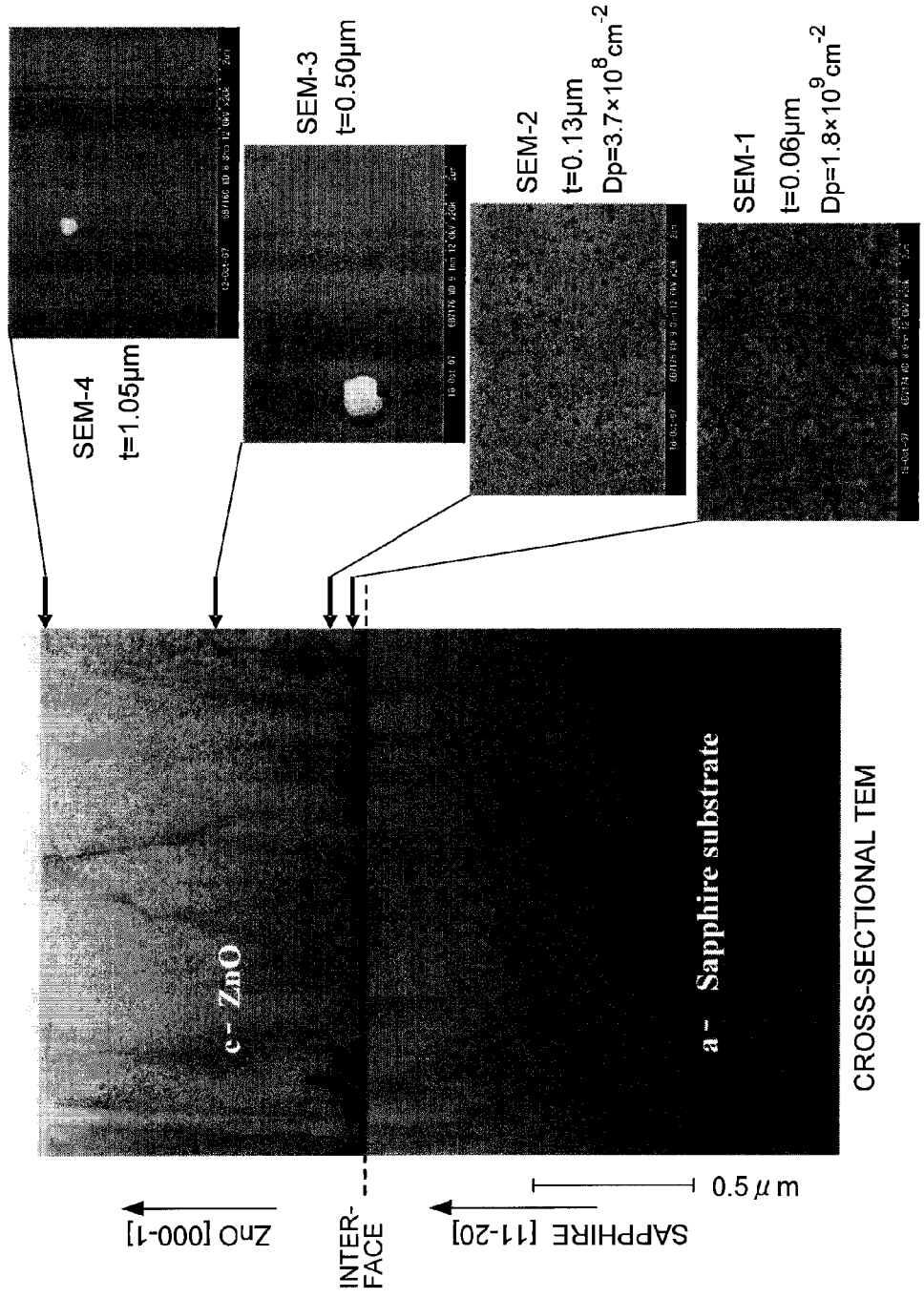
FIG. 15 shows a cross-sectional TEM image of a ZnO-based semiconductor layer (a third single-crystal layer) after grown and surface SEM images (SEM-1 to SEM-4) of grown layers of different layer thicknesses.

The surface morphology, flatness and crystallinity were evaluated with SEM (scanning electron microscope) and TEM (transmission electron microscope). FIG. 15 shows a cross-sectional TEM bright field image (layer thickness: 1.05 µm) after the growth of the ZnO-based semiconductor layer (third single-crystal layer) 12 and surface SEM images (SEM-1 to SEM-4) of grown layers of different layer thicknesses. The SEM images SEM-3 and SEM-4 were taken so as to include a minute crystal adsorbed to the surface in the view field on purpose as seen in the SEM image in order to prove that the surface was in focus. Note that viewing the whole, the occurrence of an adsorbed minute crystal is rare.

For layer thicknesses (t) of 0.06 µm (SEM-1) and 0.13 µm (SEM-2), pit densities are $1.8 \times 10^9$ $cm^{-2}$ and $3.7 \times 10^8$ $cm^{-2}$, respectively. Dislocations originating from the substrate interface decrease in number with increase in layer thickness. For a layer thickness of 0.5 µm (SEM-3), hollows of pits have vanished with dislocations converging. That is, the vanishment of hollows of pits is related to the convergence of dislocations. As such, it was found that the ZnO-based semiconductor layer 12 formed on the second ZnO layer (second single-crystal layer) 11B grows substantially in the form of a layer from the beginning of the growth, and that as the layer thickness increases, threading-dislocations originating from the substrate interface remarkably decrease in number. In addition, it was found that at an early stage of the growth when the layer thickness is 0.5 µm, the grown layer becomes completely flat with dislocation density remarkably reduced. As seen from the SEM image (SEM-4) for the grown layer of a layer thickness (t) of 1.05 µm, the layer subsequently grows with maintaining flatness. Thus, the grown layer thickness is preferably 0.5 µm or greater.

In contrast, in the case of growing the ZnO-based semiconductor layer 12 on the first ZnO layer 11A without forming the second ZnO layer 11B, in order to obtain high flatness, the layer thickness is preferably 1.5 µm or greater, but by providing the second ZnO layer 11B, the layer thickness of the ZnO-based semiconductor layer to obtain high flatness can be reduced. In addition, the ZnO-based semiconductor layer 12 of good crystallinity with a smaller amount of threading-dislocations can be formed.

<Growth Rate>

The growth rate is preferably in the range of 5 to 60 nm/min. If the growth rate is 60 nm/min or greater, abnormal growth is likely to occur.

<Crystal Composition>

For example, a $Mg_xZn_{(1-x)}O$ ($0 \leq x \leq 0.43$) crystal can be used as the ZnO-based semiconductor layer 12. However, as Mg composition x increases, the difference in lattice constant in an a-axis direction increases, resulting in an increase in the defect density of the formed semiconductor crystal layer. Hence, it is more preferable that $0 \leq x \leq 0.3$.

As mentioned above, the ZnO-based semiconductor layer 12 may be another ZnO-based compound crystal. For example, it may be a ZnO-based compound crystal having some of Zn (zinc) replaced by Ca, or a ZnO-based compound crystal having some of O (oxygen) replaced by Se, S, Te, or the like.

<Material Gas>

When grown at a high temperature, a ZnO crystal of high quality can be grown because the migration lengths of reactive chemical species in the crystal growth surface are sufficient. On the other hand, gas material that is an oxygen source becomes hard to adsorb to the substrate surface, thus hindering the growth. As the oxygen source, $H_2O$ (water vapor) that is large in the polarization within the molecule, thus adsorbing even at high temperatures to the substrate surface is suitable.

As the Zn source, a metalorganic compound not containing oxygen and highly reactive with oxygen source material is suitable. Other than DMZn mentioned above, for example, DEZn (diethyl zinc) may be used. As the Mg source, Cp2Mg (biscyclopentadienyl magnesium) can be used.

<Dopants>

In order to adjust the conductivity type (n-type) of the ZnO-based semiconductor layer 12, one or more of TMGa (trimethyl gallium), TEGa (triethyl gallium), TMAl (trimethyl aluminum), TMIn (trimethyl indium), and TEIn (triethyl indium) need to be added.

They are preferably doped during the last half of the growth time period in which the crystal plane becomes flat. Specifically, they are preferably doped after the layer grows 0.25 µm thick. That is, it is preferable that the ZnO-based semiconductor layer 12 is an undoped layer at least 0.25 μm thick.
<Growth Sequence>

Figure 16:
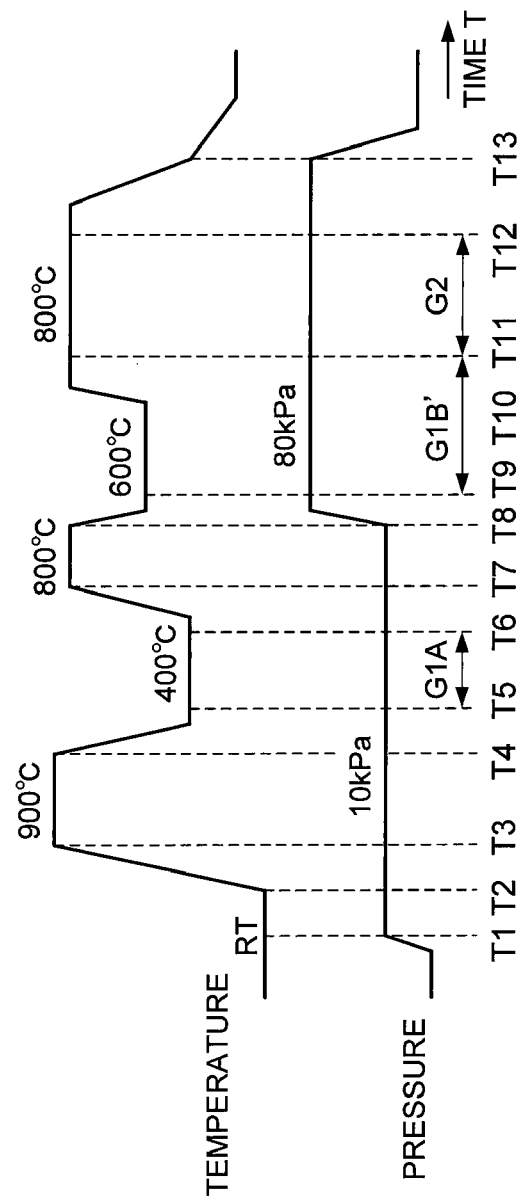
FIG. 16 shows a crystal growth sequence of a modification of Embodiment 1.

FIG. 16 shows a crystal growth sequence of a modification of the present embodiment. In this modification, the second ZnO layer (second single-crystal layer) 11B continues to be grown until the ZnO-based semiconductor layer (ZnO layer) 12 starts to be grown. The other growth conditions are the same as in the above embodiment.

More specifically, in the above-described embodiment, before the growth temperature was raised from 600° C. (second low growth temperature) to 800° C. (high growth temperature), the growth of the second ZnO layer (second single-crystal layer) 11B is finished (growth period T=T9 to T10, indicated by period G1B in FIG. 13). In this modification, DMZn continues to be supplied until the ZnO-based semiconductor layer 12 starts to be grown (T=T11), and the growth period of the second single-crystal layer 11B is T9 to T11 (period G1B' in FIG. 16). The temperature rise time is preferably within 10 minutes in terms of preventing hillocks from occurring, and so on.

Figure 17:
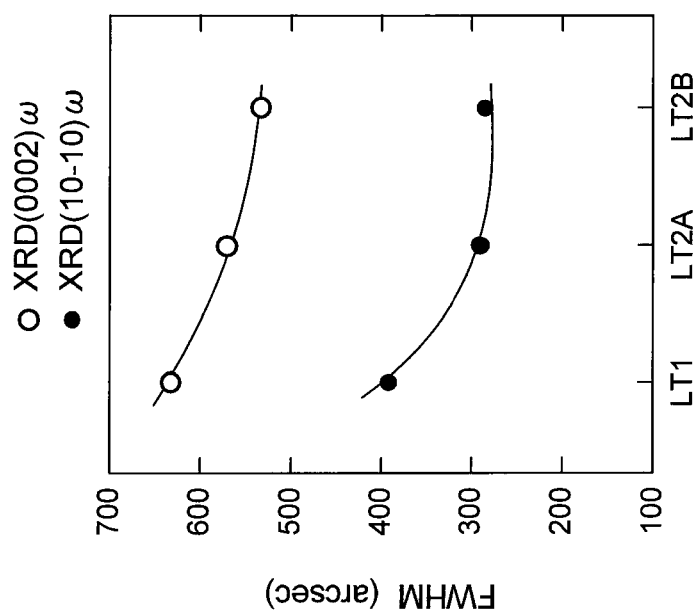
FIG. 17 shows the full width at half maximum (FWHM) of the X-ray diffraction rocking curve for the case of growing the high-temperature grown layer on the first low-temperature grown layer (LT1), the case of growing on the second ZnO layer 11B grown in the growth period T=T9 to T10 (LT2A), and the case of growing on the second ZnO layer 11B grown in the growth period T=T9 to T11 (LT2B)

FIG. 17 shows the full width at half maximum (FWHM) of the X-ray diffraction (0002) ω and (10-10) ω rocking curves for the case of growing the ZnO-based semiconductor layer (third single-crystal layer) 12 on the first ZnO layer 11A (LT1), the case of growing the ZnO-based semiconductor layer 12 on the second ZnO layer 11B grown in period T=T9 to T10 (period G1B in FIG. 13) (LT2A), and the case of growing the ZnO-based semiconductor layer 12 on the second ZnO layer 11B grown in period T=T9 to T11 (period G1B' in FIG. 16) (LT2B).

It can be seen that the layers 12 in the cases of growing the ZnO-based semiconductor layer 12 on the second ZnO layer 11B (LT2A, LT2B) are superior in crystallinity, and that the layer 12 in the case where the second ZnO layer 11B continued to be grown until the ZnO-based semiconductor layer 12 started to be grown (LT2B) is further superior in crystallinity.

As described above in detail, by using the above growth conditions, the ZnO-based semiconductor layer 12 having high flatness and crystallinity can be grown on the ZnO layer (second single-crystal layer) 11B that is thin but excellent in flatness and single-crystal quality. That is, the ZnO-based semiconductor layer (third single-crystal layer) 12 can be grown to have enough thickness to be applied to device manufacture with having further high flatness and crystallinity, and hence can be applied widely to device manufacture. For example, a light emitting layer (active layer), an LED light emitting operation layer, a clad layer of semiconductor laser devices, or a device operation layer of electronic devices or the like can be grown directly on the ZnO-based semiconductor layer 12. Or, the ZnO-based semiconductor layer 12 grown under the above growth conditions may be arranged to form part of an LED light emitting operation layer, a clad layer, or a device operation layer.
[With-Grown-Layer Substrate 15]

The with-grown-layer substrate 15 obtained through the above processes can be subsequently used in the MOCVD apparatus to manufacture semiconductor devices without being cooled. Or, after cooled, semiconductor devices may be manufactured using the MOCVD apparatus or another crystal growing apparatus.

That is, with the with-grown-layer substrate 15, a single crystal can be grown directly on the single-crystal layer (ZnO-based semiconductor layer 12) excellent in single-crystal quality and flatness using the MOCVD apparatus or another crystal growing apparatus. Thus, a high quality ZnO-based semiconductor layer having a small number of crystal defects and excellent in single-crystal quality and flatness can be formed.

Further, with the with-grown-layer substrate 15, optical semiconductor devices, various electronic devices, and the like can be formed by various methods other than MOCVD such as MBE, plasma CVD, PLD (Pulsed Laser Deposition), and hydride VPE.

As such, according to the present invention, there is provided a with-grown-layer substrate having formed thereon high quality single-crystal layers having a small number of crystal defects and low defect density, and excellent in single-crystal quality and flatness which is applicable to the manufacture of optical semiconductor devices and various electronic devices.

Embodiment 4

Figure 18:
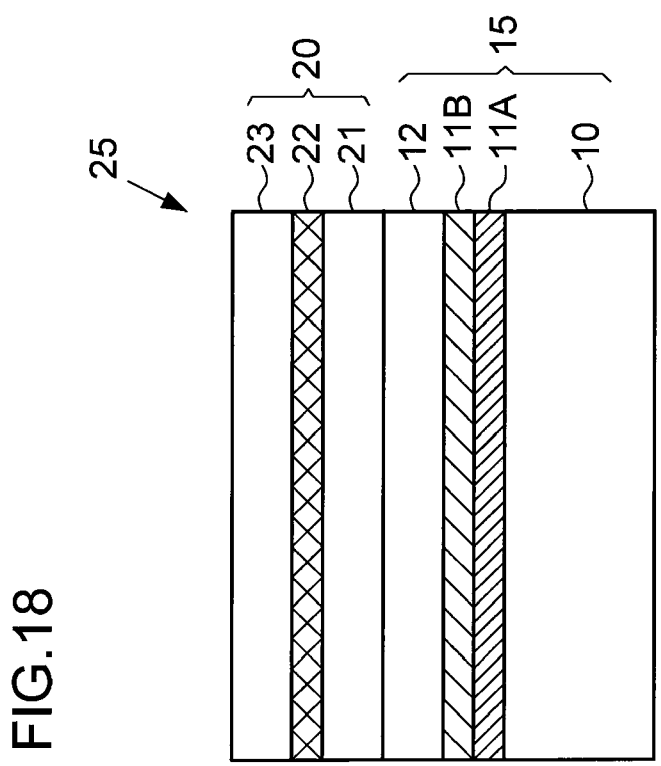
FIG. 18 is a cross-sectional view of a semiconductor light emitting device structure grown on the substrate according to the present invention.

FIG. 18 is a cross-sectional view of a semiconductor light emitting device structure grown on the substrate 10 according to the present invention. More specifically, a light emitting operation layer (hereinafter also called an LED operation layer) 20 consisting of an n-type ZnO-based semiconductor layer 21, a ZnO-based semiconductor active layer 22, and a p-type ZnO-based semiconductor layer 23 was formed on the with-grown-layer substrate 15 having the first ZnO layer (first single-crystal layer) 11A, a second ZnO layer (second single-crystal layer) 11B, and the ZnO-based semiconductor layer 12 formed thereon according to the above embodiment. Crystal growth conditions of the LED operation layer 20 were the same as those of the ZnO-based semiconductor layer 12 in the above embodiment unless otherwise noted. That is, the crystal growth sequence was the same as that shown in FIG. 13, and using the same growth temperature, growth pressure, material gas, etc., as in the period (G2) of T=T11 to T12, the n-type ZnO-based semiconductor layer 21, ZnO-based semiconductor active layer 22, and p-type ZnO-based semiconductor layer 23 were sequentially formed on the ZnO-based semiconductor layer 12. Growth conditions such as growth temperature and growth pressure of the LED operation layer 20 may not necessarily be the same as those of the ZnO-based semiconductor layer 12. That is, crystal growth conditions of the LED operation layer 20 are preferably within the ranges of those of the ZnO-based semiconductor layer 12.

As such, by growing an LED operation layer on the ZnO-based semiconductor layer 12 having good flatness and single-crystal quality under growth conditions similar to those of the ZnO-based semiconductor layer 12, the LED operation layer flat and excellent in crystallinity can be formed. Description will be made below taking as an example the case of growing $Mg_xZn_{(1-x)}O$ as the ZnO-based semiconductor.

After an undoped ZnO-based semiconductor layer 12 was grown, with maintaining the growth temperature and growth pressure (800° C., 80 kPa) the n-type ZnO-based semiconductor layer 21 was grown. The undoped ZnO-based semiconductor layer 12 is preferably at least 0.25 μm thick as mentioned above.

Keeping the $H_2O$ (water vapor) flow rate at 640 μmol/min and increasing the DMZn flow rate from 10 μmol/min to 30 μmol/min, a Ga-doped $Mg_xZn_{(1-x)}O$ crystal 3 μm thick was grown. The flow rate of Mg material gas (Cp2Mg) should be adjusted according to Mg crystal composition x.

In order to control the conductivity type (n-type), TEGa was doped during the $Mg_xZn_{(1-x)}O$ crystal growth so that its concentration in the $Mg_xZn_{(1-x)}O$ crystal became $5 \times 10^{18}$ $cm^{-3}$.

Then, the DMZn flow rate was decreased to 1 μmol/min, and the active layer 22 ($Mg_xZn_{(1-x)}O$ crystal) 30 nm thick was grown. Here, by decreasing the DMZn flow rate, the ratio of the $H_2O$ (water vapor) flow rate to the DMZn flow rate (VI/II ratio) was increased from 21 to 640. Thereby, deficiency of oxygen or the like in the grown layer could be reduced, and thus high light-emission efficiency could be obtained.

Then, the p-type ZnO-based semiconductor layer 23 was grown. Specifically, at a DMZn flow rate of 1 μmol/min, an N (nitrogen)-doped $Mg_xZn_{(1-x)}O$ crystal 100 nm thick was grown. Here, during the $Mg_xZn_{(1-x)}O$ crystal growth, $NH_3$ (ammonia) was supplied as p-type impurity material (dopant) at a flow rate of 180 μmol/min so that nitrogen impurity concentration Na (N) became $8 \times 10^{19}$ cm$^{-3}$.

After the above process finished, the pressure was maintained at 80 kPa with keeping water vapor flowing until the substrate temperature became 300° C. After the substrate temperature became 300° C. or lower, water vapor was stopped, and the substrate was taken out of the reaction chamber after the substrate temperature became room temperature.

The case of using $Mg_xZn_{(1-x)}O$ crystals as the n-type ZnO-based semiconductor layer 21, active layer 22, and p-type ZnO-based semiconductor layer 23 has been described.

In this case, n-type ZnO-based semiconductor layer 21: $Mg_xZn_{(1-x)}O$ ($0 \leq x \leq 0.43$), p-type ZnO-based semiconductor layer 23: $Mg_xZn_{(1-x)}O$ ($0 \leq x \leq 0.43$), and active layer 22: $Mg_xZn_{(1-x)}O/Mg_yZn_{(1-y)}O$ ($0 \leq (x, y) \leq 0.43$; $y < x$) can be used.

Here, Mg crystal composition x should be 0.63 or less for a layer thickness of about 0.5 μm or less and 0.43 or less for 0.5 μm or greater. This is because if the Mg composition is higher, the phase separation of MgO occurs in the MgZnO crystal.

Each of the n-type ZnO-based semiconductor layer 21, the active layer 22, and the p-type ZnO-based semiconductor layer 23 may be of a multilayered structure depending on the light emitting device characteristic. Further, the active layer 22 may be of an MQW (Multi-quantum well) structure. Especially in the case of an MQW active layer, variation in the thickness of crystal layers (a well layer, a barrier layer) varies quantum state energy, quantum state density, and the like, thus greatly affecting the emission wavelength, internal quantum efficiency, and the like, and hence the effect produced by using the ZnO-based semiconductor layer 12 excellent in flatness and single-crystal quality is further remarkable.

A with-LED-operation-layer substrate 25 that was manufactured through the above-described process was evaluated with a differential interference microscope and a scanning electron microscope (SEM). FIG. 19A is a differential interference microscope image of the surface of the with-LED-operation-layer substrate 25 produced through the above-described process. For comparison, FIG. 19B shows a differential interference microscope image of the surface of the substrate 25 having the LED operation layer formed at a growth temperature (Tg) of 680° C. From these results, it was ascertained that the surface of the with-LED-operation-layer substrate 25 produced through the above process was free of bumps/dips or pits and was an extremely flat mirror surface in macroscopic to microscopic views.

[Manufacture of Semiconductor Light Emitting Devices]

Figure 20:
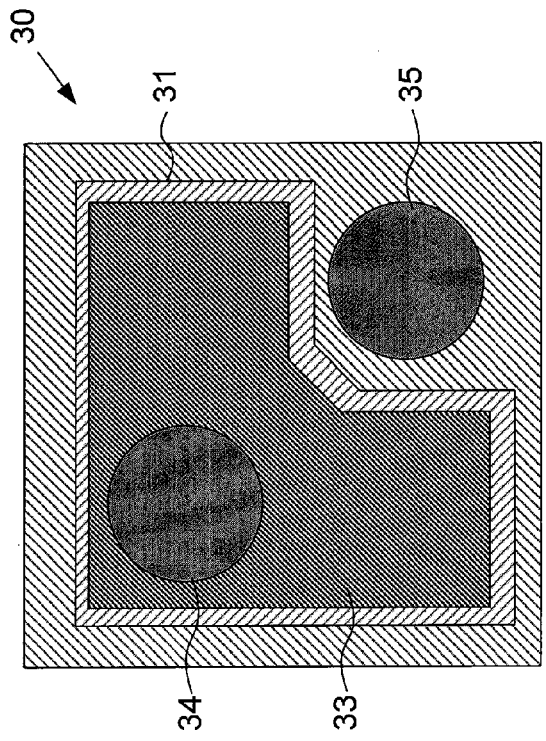
FIG. 20 is a top plan view of a semiconductor light emitting device (LED)
Figure 21:
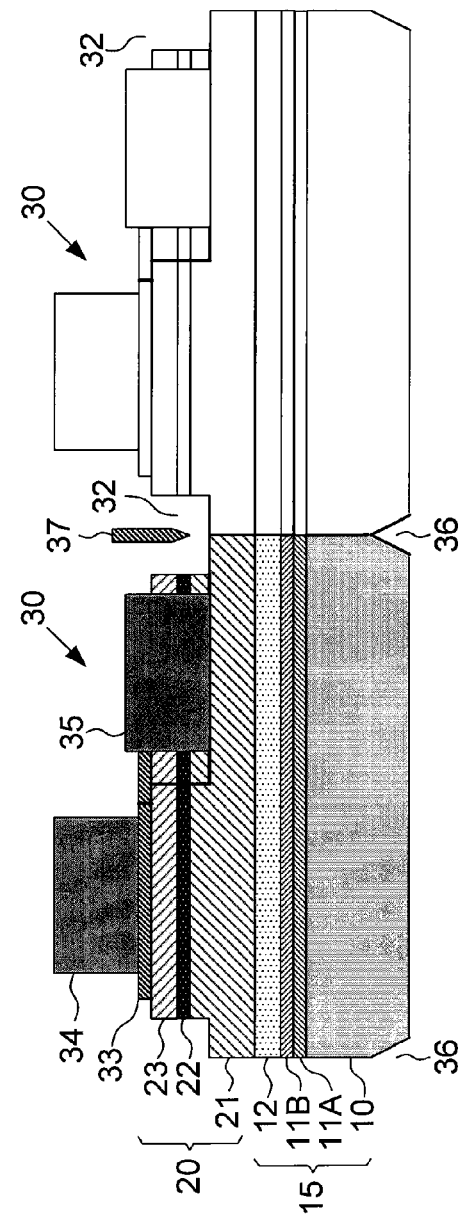
FIG. 21 is a cross-sectional view of the semiconductor light emitting device (LED).

Semiconductor light emitting devices (LEDs) were manufactured using the with-LED-operation-layer substrate 25 produced through the above process, through the same processes as in Embodiment 2. FIG. 20 is a top plan view of a semiconductor light emitting device (LED) 30, and FIG. 21 is a cross-sectional view of LEDs 30. FIG. 21 shows that two LEDs 30 and a device partition groove 32 for separating these by breaking are formed.

Specifically, using photolithography, EB (electron beam) vapor deposition, and so on, a p-side electrode 33, a p-side connection electrode 34, and an n-side connection electrode 35 were formed. Processes such as etching, heat treatment, back side polishing, and the formation of scribe grooves were the same as in Embodiment 2. Also, processes such as the breaking (dividing into chips) of the wafer formed in this way were the same as in Embodiment 2.

Because the surface of the with-LED-operation-layer substrate 25 of the present invention was free of bumps/dips, the bottom of the device partition groove 32 was also formed extremely flat, and pressure could be accurately applied to the partition groove bottom with a knife edge 37. Thus, when applying pressure to cleave, stress was uniformly applied, and hence the occurrences of cleavage failure due to device section chipping, the deviation of a cleaved surface, etc., could be reduced, improving the cleavage yield. Further, without a potential crystal grain boundary (domain) in crystal planes, when cleaving, chips in a crystal layer due to a grain boundary decreased in number, improving the separation yield.

When devices were formed using the with-LED-operation-layer substrate 25 of the present invention, a resist pattern formation yield was about 98%. Also, the cleavage yield was extremely good, about 98%.

As described above, because an LED operation layer is grown on the ZnO-based semiconductor layer 12 that is a high quality single crystal layer having a small number of crystal defects and excellent in single-crystal quality and flatness, the LED operation layer flat and excellent in crystallinity can be formed, and high performance LEDs having leak current and current concentration suppressed and thus high in light-emission efficiency and excellent in device lifetime can be manufactured. Further, high process accuracy in semiconductor processes such as lithography and etching can be obtained, and the production yield in cleavage, breaking, and like is also high.

In the above embodiments, description has been made taking as an example the case of applying the present invention to a semiconductor light emitting device (LED), but not being limited to this, the present invention can be applied to optical semiconductor devices and electronic devices which can be formed using a ZnO-based semiconductor layer, such as laser diodes (LD), surface acoustic wave devices, and MOSFETs.

As described above in detail, according to the present invention, using metalorganic compound material not containing oxygen together with $H_2O$ (water vapor) having high reactivity with the metalorganic compound material, a zinc oxide single-crystal layer (first single-crystal layer) can be grown at a low growth temperature and a low growth pressure on a substrate of another material such as an A-plane sapphire substrate. Further, by performing heat treatment under low pressure (reduced pressure) in a water vapor atmosphere, the single-crystal quality and flatness of the grown layer can be further improved. In addition, by growing a single-crystal layer (second single-crystal layer) of a zinc-oxide-based compound semiconductor on the first single-crystal layer at a low growth temperature, its single-crystal quality and flatness can be improved. The single-crystal layer is excellent in flatness and single-crystal quality and also has a small number of crystal defects and low defect density. Moreover, because the MOCVD method is used, large area growth and multi-wafer growth are possible. Thus, the present method is excellent in mass productivity and production costs.

Furthermore, the ZnO-based compound semiconductor layer having further high flatness and crystallinity can be grown on the second single-crystal layer excellent in flatness and single-crystal quality. The ZnO-based compound semiconductor layer (third single-crystal layer) 12 can be grown to have enough thickness to be applied to device manufacture as well as high flatness and crystallinity. Therefore, an LED light emitting operation layer, a clad layer of semiconductor laser devices, a device layer of electronic devices, or the like can be grown directly on the ZnO-based semiconductor layer 12.

By growing an LED operation layer on the ZnO-based semiconductor layer 12, the LED operation layer flat and excellent in crystallinity can be formed, and high output power, high performance LEDs having leak current and current concentration suppressed and thus high in light-emission efficiency can be provided. Further, LEDs excellent in device lifetime can be manufactured. Yet further, high accuracy in semiconductor processes is obtained, and the production yield in cleavage, breaking, and like is also high.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Applications P2008-236922 and P2008-236923 which are hereby incorporated by reference.

What is claimed is:

1. A method of growing a zinc-oxide-based semiconductor layer on a substrate by an MOCVD method, using water vapor and a metalorganic compound not containing oxygen, comprising:
   (a) performing crystal growth at a low growth temperature and at a low growth pressure in a range of 1 kPa to 30 kPa to form a low-temperature grown single-crystal layer; and
   (b) performing crystal growth at a high growth temperature and at a pressure higher than said low growth pressure to form a high-temperature grown single-crystal layer on said low-temperature grown single-crystal layer,
   wherein said low-temperature grown single-crystal layer is a zinc oxide (ZnO) layer, and said high-temperature grown single-crystal layer is a $Mg_xZn_{(1-x)}O$ layer, where $0 \leq x \leq 0.43$, and
   wherein in said (b) performing crystal growth to form said high-temperature grown single-crystal layer, an impurity is doped after a thickness of the grown layer becomes greater than 1 μm.

2. A method according to claim 1, wherein said low growth temperature is a temperature in a range of 250° C. to 450° C.

3. A method according to claim 1, wherein said high growth temperature is a temperature in a range of 700° C. to 850° C.

4. A method according to claim 1, wherein said pressure higher than said low growth pressure is a pressure in a range of 40 kPa to 120 kPa.

5. A method according to claim 1, wherein said (b) performing crystal growth to form said high-temperature grown single-crystal layer comprises performing heat treatment on said low-temperature grown single-crystal layer before the growth of said high-temperature grown single-crystal layer.

6. A method according to claim 1, wherein said substrate is an α-sapphire single crystal, and a crystal growth plane is a {11-20} plane.

7. A method according to claim 1, wherein a layer thickness of said low-temperature grown single-crystal layer is in a range of 5 nm to 60 nm.

8. A method according to claim 1, wherein a layer thickness of said high-temperature grown single-crystal layer is 1.5 μm or greater.

9. A method according to claim 1, wherein said substrate is one of sapphire, gallium oxide ($Ga_2O_3$), silicon carbide (SiC), gallium nitride (GaN), and silicon substrates.

10. A method of growing a zinc-oxide-based semiconductor layer on a substrate by an MOCVD method, using water vapor and a metalorganic compound not containing oxygen, comprising:
    (a) performing crystal growth at a low growth temperature and at a low growth pressure in a range of 1 kPa to 30 kPa to form a low-temperature grown single-crystal layer; and
    (b) performing crystal growth at a high growth temperature and at a pressure higher than said low growth pressure to form a high-temperature grown single-crystal layer on said low-temperature grown single-crystal layer,
    wherein said (a) performing crystal growth to form said low-temperature grown single-crystal layer comprises:
       (a1) performing crystal growth at a first low growth temperature and at the low growth pressure in the range of 1 kPa to 30 kPa to form a first low-temperature grown single-crystal layer; and
       (a2) performing crystal growth at a second low growth temperature higher than said first low growth temperature and at a pressure higher than said low growth pressure to form a second low-temperature grown single-crystal layer on said first low-temperature grown single-crystal layer.

11. A method according to claim 10, wherein said first low growth temperature is a temperature in a range of 250° C. to 450° C., and said second low growth temperature is a temperature in a range of 500° C. to 650° C.

12. A method according to claim 10, wherein said first low-temperature grown single-crystal layer and said second low-temperature grown single-crystal layer are each a zinc oxide (ZnO) layer, and said high-temperature grown single-crystal layer is a $Mg_xZn_{(1-x)}O$ layer, where $0 \leq x \leq 0.43$.

13. A method according to claim 10, wherein a layer thickness of said first low-temperature grown single-crystal layer is in a range of 5 nm to 60 nm.

14. A method according to claim 10, wherein a layer thickness of said second low-temperature grown single-crystal layer is in a range of 5 nm to 80 nm.

15. A method according to claim 10, wherein a layer thickness of said high-temperature grown single-crystal layer is greater than or equal to 0.5 μm.

16. A method according to claim 10, wherein a growth rate of said second low-temperature grown single-crystal layer and said high-temperature grown single-crystal layer is 60 nm/min or less.

17. A method according to claim 10, wherein said (a2) forming said second low-temperature grown single-crystal layer includes forming said second low-temperature grown single-crystal layer while changing the growth temperature from said second low growth temperature to said high growth temperature, upon transition to said (b) performing crystal growth to form said high-temperature grown single-crystal layer.

18. A method according to claim 10, wherein said high growth temperature is a temperature in a range of 700° C. to 850° C.

19. A method according to claim 10,
wherein said pressure at which said (b) performing crystal growth to form said high-temperature grown single-crystal layer is performed is a pressure in a range of 40 kPa to 120 kPa, and
wherein said pressure at which said (a2) performing crystal growth to form said second low-temperature grown single-crystal layer is performed is a pressure in a range of 40 kPa to 120 kPa.

20. A method according to claim 10, wherein said (b) performing crystal growth to form said high-temperature grown single-crystal layer comprises performing heat treatment on said low-temperature grown single-crystal layer before the growth of said high-temperature grown single-crystal layer.

21. A method according to claim 10, wherein said substrate is an α-sapphire single crystal, and a crystal growth plane is a {11-20} plane.

22. A method according to claim 10, wherein said substrate is one of sapphire, gallium oxide ($Ga_2O_3$), silicon carbide (SiC), gallium nitride (GaN), and silicon substrates.

23. A method according to claim 1, wherein said (a) performing crystal growth to form said low-temperature grown single-crystal layer comprises:
(a1) performing crystal growth at a first low growth temperature and at the low growth pressure in the range of 1 kPa to 30 kPa to form a first low-temperature grown single-crystal layer; and
(a2) performing crystal growth at a second low growth temperature higher than said first low growth temperature and at a pressure higher than said low growth pressure to form a second low-temperature grown single-crystal layer on said first low-temperature grown single-crystal layer.

* * * * *